(12) United States Patent
Boon et al.

(10) Patent No.: US 8,063,493 B2
(45) Date of Patent: Nov. 22, 2011

(54) SEMICONDUCTOR DEVICE ASSEMBLIES AND PACKAGES

(75) Inventors: Suan Jeung Boon, Singapore (SG); Yong Poo Chia, Singapore (SG); Meow Koon Eng, Singapore (SG); Siu Waf Low, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/627,352

(22) Filed: Nov. 30, 2009

(65) Prior Publication Data

US 2010/0072603 A1      Mar. 25, 2010

Related U.S. Application Data

(60) Continuation of application No. 11/215,472, filed on Aug. 29, 2005, now Pat. No. 7,633,159, which is a division of application No. 10/717,421, filed on Nov. 19, 2003, now Pat. No. 7,208,335.

(30) Foreign Application Priority Data

Sep. 30, 2003   (SG) ............................... 200305779-1

(51) Int. Cl.
*H01L 23/52*   (2006.01)
*H01L 23/48*   (2006.01)
*H01L 29/40*   (2006.01)

(52) U.S. Cl. ................. 257/777; 257/E25.013; 257/685; 257/686; 438/109; 361/760

(58) Field of Classification Search ........... 257/E25.013, 257/E25.018, E23.068, 685, 686, 690, 723, 257/730, 773, 777; 438/108, 109; 361/760
See application file for complete search history.

(56) References Cited

U.S. PATENT DOCUMENTS 3,359,463 A   12/1967   Jones, Jr.
3,691,429 A    9/1972   Glaser
(Continued)

FOREIGN PATENT DOCUMENTS

JP          5927549           2/1984
(Continued)

OTHER PUBLICATIONS

NN81055595: Edge Mounted MLC Packaging Scheme. May 1981; IBM Technical Disclosure Bulletin, May 1981 US: vol. 23, Issue #12, p. 5595-5598; Publication Date: May 1, 1981.

(Continued)

*Primary Examiner* — Chris Chu
(74) *Attorney, Agent, or Firm* — TraskBritt

(57) ABSTRACT

A sacrificial substrate for fabricating semiconductor device assemblies and packages with edge contacts includes conductive elements on a surface thereof, which are located so as to align along a street between each adjacent pair of semiconductor devices on the device substrate. A semiconductor device assembly or package includes a semiconductor device, a redistribution layer over an active surface of the semiconductor device, and dielectric material coating at least portions of an outer periphery of the semiconductor device. Peripheral sections of contacts are located on the peripheral edge and electrically isolated therefrom by the dielectric coating. The contacts may also include upper sections that extend partially over the active surface of the semiconductor device. The assembly or package may include any type of semiconductor device, including a processor, a memory device, and emitter, or an optically sensitive device.

20 Claims, 12 Drawing Sheets

U.S. PATENT DOCUMENTS

| | | |
|---|---|---|
| 3,964,087 A | 6/1976 | Mallon |
| 4,767,344 A | 8/1988 | Noschese |
| 4,877,301 A | 10/1989 | Yokomori et al. |
| 4,956,694 A | 9/1990 | Eide |
| 5,111,278 A | 5/1992 | Eichelberger |
| 5,138,115 A | 8/1992 | Lam |
| 5,266,833 A | 11/1993 | Capps |
| 5,313,096 A | 5/1994 | Eide |
| 5,394,303 A * | 2/1995 | Yamaji ............ 361/749 |
| 5,434,745 A | 7/1995 | Shokrgozar et al. |
| 5,440,452 A | 8/1995 | Kitahara |
| 5,502,667 A | 3/1996 | Bertin et al. |
| 5,541,450 A | 7/1996 | Jones et al. |
| 5,639,695 A | 6/1997 | Jones et al. |
| 5,644,839 A | 7/1997 | Stone |
| 5,714,405 A * | 2/1998 | Tsubosaki et al. ........... 438/118 |
| 5,723,901 A | 3/1998 | Katsumata |
| 5,752,182 A | 5/1998 | Nakatsuka et al. |
| 5,818,107 A * | 10/1998 | Pierson et al. ............ 257/723 |
| 5,834,162 A | 11/1998 | Malba |
| 5,895,970 A * | 4/1999 | Miyoshi ............ 257/696 |
| 5,925,924 A | 7/1999 | Cronin et al. |
| 5,950,070 A | 9/1999 | Razon et al. |
| 5,952,717 A * | 9/1999 | Taniguchi et al. ........... 257/734 |
| 5,986,209 A | 11/1999 | Tandy |
| 6,002,167 A * | 12/1999 | Hatano et al. ............ 257/696 |
| 6,004,867 A | 12/1999 | Kim et al. |
| 6,028,365 A * | 2/2000 | Akram et al. ............ 257/778 |
| 6,034,438 A | 3/2000 | Petersen |
| 6,048,752 A | 4/2000 | Linderman |
| 6,072,236 A | 6/2000 | Akram et al. |
| 6,147,398 A | 11/2000 | Nakazato et al. |
| 6,228,684 B1 | 5/2001 | Maruyama |
| 6,232,655 B1 | 5/2001 | Sugimura |
| 6,252,300 B1 | 6/2001 | Hsuan et al. |
| 6,306,680 B1 | 10/2001 | Fillion et al. |
| 6,316,287 B1 | 11/2001 | Zandman et al. |
| 6,323,546 B2 | 11/2001 | Hsuan et al. |
| 6,326,689 B1 | 12/2001 | Thomas |
| 6,329,708 B1 * | 12/2001 | Komiyama ............ 257/678 |
| 6,335,225 B1 | 1/2002 | Doan |
| 6,344,401 B1 | 2/2002 | Lam |
| 6,346,432 B2 | 2/2002 | Sugimura |
| 6,352,923 B1 | 3/2002 | Hsuan et al. |
| 6,358,772 B2 * | 3/2002 | Miyoshi ............ 438/106 |
| 6,358,833 B1 | 3/2002 | Akram et al. |
| 6,376,769 B1 | 4/2002 | Chung |
| 6,379,982 B1 | 4/2002 | Ahn et al. |
| 6,379,999 B1 | 4/2002 | Tanabe |
| 6,414,384 B1 | 7/2002 | Lo et al. |
| 6,433,418 B1 | 8/2002 | Fujisawa et al. |
| 6,461,956 B1 | 10/2002 | Hsuan et al. |
| 6,479,758 B1 | 11/2002 | Arima et al. |
| 6,504,244 B2 | 1/2003 | Ichinose et al. |
| 6,521,485 B2 | 2/2003 | Su et al. |
| 6,521,995 B1 | 2/2003 | Akram et al. |
| 6,534,386 B2 | 3/2003 | Irie |
| 6,552,426 B2 | 4/2003 | Ishio et al. |
| 6,562,647 B2 | 5/2003 | Zandman et al. |
| 6,576,992 B1 | 6/2003 | Cady et al. |
| 6,582,992 B2 * | 6/2003 | Poo et al. ............ 438/109 |
| 6,590,257 B2 | 7/2003 | Ohuchi |
| 6,603,191 B2 | 8/2003 | Wakabayashi et al. |
| 6,607,941 B2 | 8/2003 | Prabhu et al. |
| 6,611,052 B2 | 8/2003 | Poo et al. |
| 6,623,280 B2 | 9/2003 | Oldenburg et al. |
| 6,623,297 B2 | 9/2003 | Hwang |
| 6,624,505 B2 | 9/2003 | Badehi |
| 6,656,827 B1 | 12/2003 | Tsao et al. |
| 6,693,358 B2 | 2/2004 | Yamada et al. |
| 6,710,454 B1 | 3/2004 | Boon |
| 6,722,055 B2 | 4/2004 | Shikami |
| 6,727,116 B2 | 4/2004 | Poo et al. |
| 6,759,272 B2 | 7/2004 | Tsubosaki et al. |
| 6,762,431 B2 | 7/2004 | Maruyama |
| 6,781,244 B2 | 8/2004 | Prabhu |
| 6,787,892 B2 | 9/2004 | Furuya et al. |
| 6,797,544 B2 | 9/2004 | Sakai et al. |
| 6,814,583 B1 | 11/2004 | Young et al. |
| 6,817,531 B2 | 11/2004 | Taussig et al. |
| 6,818,977 B2 | 11/2004 | Poo et al. |
| 6,841,418 B2 | 1/2005 | Jeung et al. |
| 6,849,802 B2 | 2/2005 | Song et al. |
| 6,855,572 B2 | 2/2005 | Jeung et al. |
| 6,856,023 B2 | 2/2005 | Muta et al. |
| 6,856,026 B2 | 2/2005 | Yamada et al. |
| 6,876,061 B2 | 4/2005 | Zandman et al. |
| 6,891,273 B2 | 5/2005 | Pu et al. |
| 6,972,480 B2 | 12/2005 | Zilber et al. |
| 6,998,704 B2 * | 2/2006 | Yamazaki et al. ............ 257/688 |
| 7,007,378 B2 | 3/2006 | Gaudiello et al. |
| 7,074,696 B1 | 7/2006 | Frankowsky et al. |
| 7,101,735 B2 | 9/2006 | Noma et al. |
| 7,115,984 B2 | 10/2006 | Poo et al. |
| 7,196,418 B2 * | 3/2007 | Ohno et al. .................. 257/723 |
| 7,208,335 B2 | 4/2007 | Boon et al. |
| 7,226,809 B2 | 6/2007 | Poo et al. |
| 7,259,020 B2 | 8/2007 | Sundberg et al. |
| 7,285,850 B2 | 10/2007 | Poo et al. |
| 2002/0017398 A1 | 2/2002 | Hacke et al. |
| 2002/0047210 A1 | 4/2002 | Yamada et al. |
| 2002/0139577 A1 * | 10/2002 | Miller ............ 174/261 |
| 2002/0185377 A1 | 12/2002 | Sundberg et al. |
| 2003/0092296 A1 | 5/2003 | Oldenburg et al. |
| 2003/0232462 A1 | 12/2003 | Poo et al. |
| 2004/0104453 A1 | 6/2004 | Wachtmann |
| 2004/0137723 A1 | 7/2004 | Noma et al. |
| 2004/0156177 A1 | 8/2004 | Higashitani |
| 2005/0067680 A1 | 3/2005 | Boon et al. |
| 2006/0006521 A1 | 1/2006 | Boon et al. |
| 2007/0048973 A1 | 3/2007 | Koisumi et al. |

FOREIGN PATENT DOCUMENTS

| | | |
|---|---|---|
| JP | 5943556 | 3/1984 |
| JP | 63232342 | 9/1988 |
| JP | 575014 | 3/1993 |
| JP | 0697225 | 4/1994 |
| JP | 08-148643 A | 6/1996 |
| JP | 200144361 | 2/2001 |
| JP | 2001210521 | 8/2001 |
| JP | 20038066 | 1/2003 |

OTHER PUBLICATIONS

Australian Search Report for Application No. SG 200305779-1 dated Apr. 15, 2005, 5 pages.

Written Opinion for Application No. SG 200305779-1 dated May 12, 2006 (5 pages).

\* cited by examiner

SEMICONDUCTOR DEVICE ASSEMBLIES AND PACKAGES

CROSS-REFERENCE TO RELATED APPLICATIONS

This application is a continuation of U.S. patent application Ser. No. 11/215,472, filed Aug. 29, 2005, now U.S. Pat. No. 7,633,159, issued Dec. 15, 2009, which application is a divisional of U.S. patent application Ser. No. 10/717,421, filed Nov. 19, 2003, now U.S. Pat. No. 7,208,335, issued Apr. 24, 2007. The disclosure of the previously referenced patent applications referenced is hereby incorporated by reference in its entirety. The subject matter of this application is also related to U.S. patent application Ser. No. 11/430,376 filed May 8, 2006, now abandoned; U.S. patent application Ser. No. 10/440,590, filed May 19, 2003, now U.S. Pat. No. 7,226,809, issued Jun. 5, 2007; U.S. patent application Ser. No. 10/183,820, filed Apr. 27, 2004, now U.S. Pat. No. 6,727,116, issued Apr. 27, 2004; U.S. patent application Ser. No. 11/430,375, filed May 8, 2006, now U.S. Pat. No. 7,285,850, issued Oct. 23, 2007; U.S. patent application Ser. No. 10/736,244 filed Dec. 15, 2003, now U.S. Pat. No. 7,115,984, issued Oct. 3, 2006; U.S. patent application Ser. No. 10/197,986, filed Jul. 17, 2002, now U.S. Pat. No. 6,818,977, issued Nov. 16, 2004; and U.S. patent application Ser. No. 10/990,348, filed Nov. 16, 2004, now abandoned.

BACKGROUND OF THE INVENTION

1. Field of the Invention

The present invention relates generally to chip-scale packages and, more specifically, to chip-scale packages which include contact pads on both major surfaces thereof, as well as to methods for forming the chip-scale packages. In particular, the present invention relates to chip-scale packages that include castellated contact pads, which include surfaces, or sections, that are exposed at the outer peripheries of such packages, as well as sections that are exposed at both major surfaces of the packages.

2. Background of Related Art

Conventional semiconductor device packages are typically multi-layered structures. A conventional semiconductor device package may include, for example, a bottom layer of encapsulant material, a carrier, a semiconductor die, and a top layer of encapsulant material. In addition to being located above and beneath the semiconductor die and carrier, the encapsulant material of a conventional semiconductor device package also laterally surrounds the semiconductor device and the carrier. In addition, a conventional semiconductor device package includes input/output elements to facilitate electrical connection of the semiconductor device thereof with external electronic components.

Leads are an example of conventional input/output elements. Leads typically contribute to the dimensions of the footprint of a conventional semiconductor device package and, thus, consume an undesirably large amount of real estate upon a carrier substrate (e.g., a circuit board) to which the semiconductor device package is to be secured and electrically connected.

Other examples of such input/output elements include pins, solder balls or other discrete conductive structures (e.g., bumps, balls, columns, etc.), which contribute to the height of a conventional semiconductor device package. When coupled with the thicknesses that conventional encapsulants and carriers impart to the overall thickness of a conventional semiconductor device package, the added heights of such discrete conductive structures may result in a semiconductor device package which will protrude an undesirably large distance from a carrier substrate to which it is secured and electrically connected.

In order to keep up with the trend toward ever-decreasing the dimensions of electronic devices, various technologies have been developed to decrease the dimensions of packaged semiconductor devices. The result of many of these technologies is the so-called "chip-scale package" (CSP), a packaged semiconductor device with lateral dimensions that are roughly the same as (i.e., slightly larger than) the corresponding lateral dimensions of the semiconductor dice thereof.

Due to the relatively small, semiconductor die-dependent, lateral dimensions of CSPs, they are often formed at the so-called "wafer-scale," meaning that packaging occurs prior to severing the semiconductor devices from a wafer or other large-scale substrate. Packaging semiconductor devices at the wafer-scale avoids the difficulties that may otherwise be associated with handling such small components during chip-scale packaging thereof. Such wafer-scale packaging may include the formation of a redistribution layer (RDL), which may rearrange or effectively expand the connection pattern of bond pads on the active surface of the semiconductor device to a redistributed connection pattern, which is more suitable for connection to a carrier substrate. Alternatively, one or more interposers may be secured over the active surfaces of the semiconductor devices that are carried by a wafer or other large-scale substrate and electrically connected to such semiconductor devices to redistribute the connection patterns thereof.

Once the connection patterns of the semiconductor devices have been redistributed and either before or after the formation of a protective layer over the RDL or interposer, discrete conductive elements, such as balls, bumps, columns, or pins, may be secured to the redistributed bond pads of each CSP. These discrete conductive structures are typically arranged over the major surface in a so-called "grid array" connection pattern.

As a consequence of the use of such discrete conductive structures, chip-scale package technology typically requires inversion of the CSP face-down over a carrier substrate therefor and alignment of the discrete conductive structures of the CSP with corresponding contacts (e.g., the terminals of a circuit board). Electrical connection of a semiconductor device to a carrier substrate in this manner is referred to in the art as "flip-chip" connection or "controlled-collapse chip connection" (C4). Of course, when the discrete conductive structures comprise pins, the electrical connection technique is referred to as a "pin connection."

When flip-chip or pin connection techniques are employed, the discrete conductive elements typically space the semiconductor device apart from the carrier substrate. This space may remain open or be filled with a so-called "underfill" material. Such spacing of a semiconductor device apart from a carrier substrate may therefore impart the assembly with an undesirably high profile.

Moreover, these types of chip-scale packaging technologies typically do not permit the placement of a chip-scale package on a carrier substrate in a face-up orientation.

Accordingly, there is a need for a packaging technology which results in chip-scale packages that may be secured to carrier substrates without requiring a significant amount of spacing between the chip-scale packages and the carrier substrate and that may be electrically connected to a carrier substrate in a face-up orientation.

SUMMARY OF THE INVENTION

The present invention includes a chip-scale package with bond pads, or contact pads, that are positioned around the outer periphery thereof. Additionally, the contact pads may extend onto one or both major surfaces of the chip-scale package.

An exemplary embodiment of a chip-scale package that incorporates teachings of the present invention includes a semiconductor device, a redistribution layer formed over an active surface of the semiconductor device and in electrical isolation therefrom, and contact pads with sections that are positioned adjacent to and in electrical isolation from the outer periphery of the semiconductor device and which communicate with corresponding bond pads of the semiconductor device through the redistribution layer. One or more of the contact pads may also include an upper or lower section, which is located adjacent to and may be substantially coplanar with a respective active surface or back side of the semiconductor device.

The semiconductor device of such a chip-scale package may comprise a memory device or a processing device, or a sensor or display device. If a sensor or display device is included in a chip-scale package of the present invention, at least a sensing or emission area on the active surface thereof may be covered with an optically transparent lid.

The present invention also includes methods for forming chip-scale packages that include contact pads on the outer peripheries thereof. These methods may be effected at a wafer-scale.

As an example, a wafer or other large-scale substrate carrying a plurality of semiconductor devices, which is referred to herein as a "semiconductor substrate," may be secured to a sacrificial, or "dummy," substrate. The sacrificial substrate may include lower contact pad sections, which are referred to herein as "lower sections" for simplicity, or precursors thereto, which are referred to herein as "precursor pads." These lower sections or precursor pads are positioned so as to align with corresponding semiconductor devices when the semiconductor substrate is secured to the sacrificial substrate.

Insulative and redistribution layers are formed over the semiconductor devices by use of known processes. The results are circuit traces that communicate with bond pads and extend from the bond pads toward or to the outer periphery of the semiconductor device. If the contact pads of the chip-scale package under fabrication are to include upper sections, which are positioned adjacent to the active surface of the semiconductor device, the upper sections may also be formed during the fabrication of the redistribution layer, with at least some of the circuit traces extending to corresponding upper sections. The insulative and redistribution layers may be formed either before or after the semiconductor substrate is secured to the sacrificial substrate.

Once the insulative and redistribution layers have been formed and the semiconductor substrate has been secured to the sacrificial substrate, the semiconductor devices are at least partially severed from one another. If the sacrificial substrate includes lower sections of contact pads, such severing may expose portions (e.g., edges or a surface) of the lower sections. If the sacrificial substrate includes precursor pads thereon, such severing may sever the precursor pads or expose a surface thereof.

Next, the exposed, outer peripheral edges of the semiconductor devices are coated with an electrically insulative material. Such coating may be followed by a second cut. The result is a peripheral dielectric coating on each peripheral edge of each semiconductor device. At this point in the packaging process, the semiconductor devices that are carried by the semiconductor substrate are substantially separated from one another and are held in place relative to one another by way of the sacrificial substrate. In addition, the outer edges of any lower sections of contact pads are exposed.

Each peripheral dielectric coating is subsequently coated with a layer of conductive material. The conductive material is then patterned to form the peripherally located contact pads or peripheral sections thereof. Of course, if the contact pads of the chip-scale package include upper or lower sections, such patterning is effected such that the peripheral section of each contact pad communicates with its corresponding upper or lower section.

Thereafter, the sacrificial substrate is removed from the semiconductor substrate, with any lower sections of contact pads remaining in place. As the sacrificial substrate is removed, the chip-scale packages that have been formed are fully separated from one another.

If the semiconductor devices that are to be packaged comprise sensor or emission devices, the packaging process may differ somewhat. In particular, in other embodiments of the method of the present invention, the sensing or emission areas on the active surfaces of such semiconductor devices are protected prior to both the singulation of the semiconductor devices from one another and the introduction of dielectric material between adjacent semiconductor devices. In addition, an optically transparent lid is placed over each sensing or emission area following the formation of a redistribution layer, but prior to cutting into the dielectric material between adjacent semiconductor devices to form the peripheral dielectric coatings on the peripheral edges of the semiconductor devices. Finally, a sacrificial layer is formed over the optically transparent lids and above other locations of the semiconductor devices but not on the peripheral dielectric coatings prior to the formation of a conductive layer over these structures. As such, conductive material may be removed from desired locations, such as the optically transparent lids and other locations over the active surfaces of the semiconductor devices, by known "lift-off" techniques, while remaining on the peripheral dielectric coatings.

Of course, semiconductor device assemblies and electronic devices which include such chip-scale packages, as well as methods for forming such assemblies and electronic devices, are also within the scope of the present invention.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which depict exemplary embodiments of various aspects of the present invention:

FIGS. 4A through 9A are cross-sectional representations showing a variation of the method depicted in FIGS. 4 through 14;

DETAILED DESCRIPTION OF THE INVENTION

Figure 1:
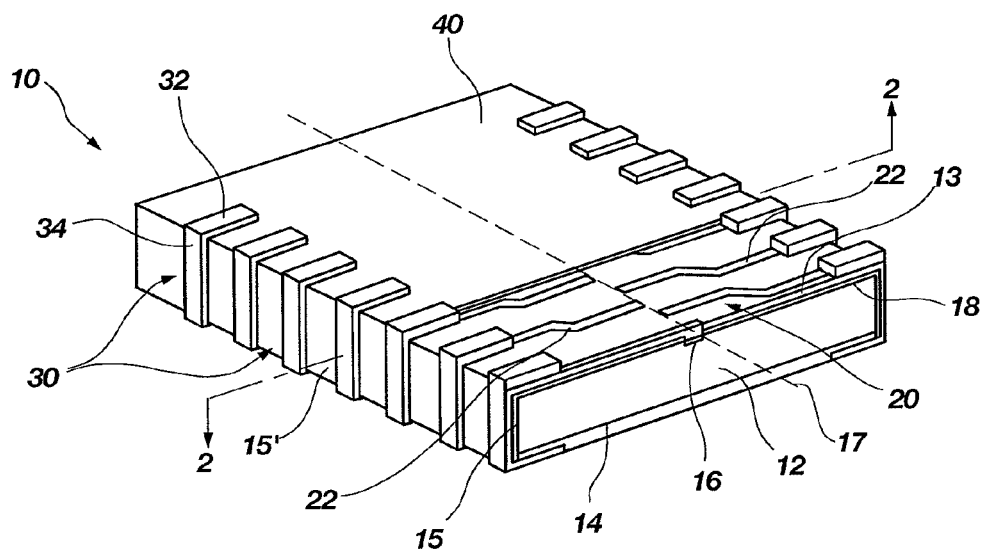
FIG. 1 is a perspective view of an exemplary embodiment of chip-scale package with castellated contact pads.
Figure 2:
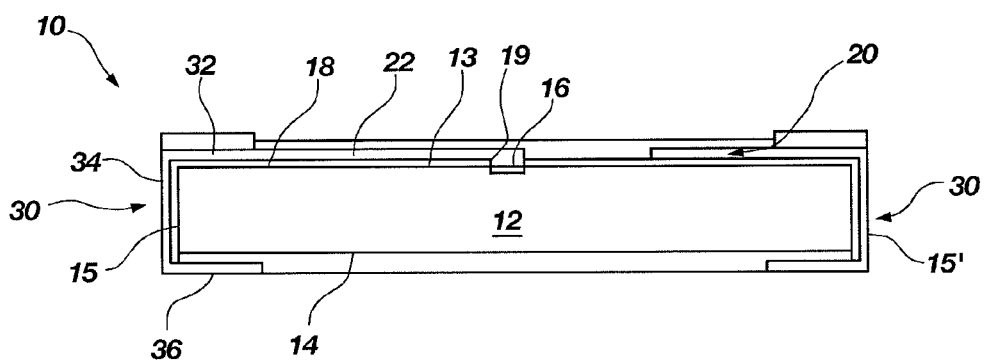
FIG. 2 is a cross-section taken along line 2-2 of FIG. 1.

With reference to FIGS. 1 and 2, an exemplary embodiment of a chip-scale package 10 that incorporates teachings of the present invention is depicted. Chip-scale package 10 includes a semiconductor device 12, a redistribution layer 20 over an active surface 13 thereof, and contact pads 30 that extend from redistribution layer 20, around an outer peripheral edge 15 (also referred to herein as "outer periphery 15") of semiconductor device 12, and onto a back side 14 of semiconductor device 12. Accordingly, each contact pad 30 includes an upper section 32, a peripheral section 34, and a lower section 36 (see FIG. 2). As contact pads 30 are located adjacent to an outer peripheral edge 15 of semiconductor device 12 and, thus, at an outer peripheral edge 15' of chip-scale package 10, they impart chip-scale package 10 with a somewhat castellated appearance and, thus, are also referred to herein as "castellated contacts."

Semiconductor device 12 includes bond pads 16 on active surface 13 thereof. Bond pads 16 are arranged substantially linearly along a centerline 17 of semiconductor device 12, although semiconductor devices with other bond pad arrangements, or "footprints," may also be used in chip-scale packages that incorporate teachings of the present invention.

By way of example only, semiconductor device 12 may comprise a memory device, such as a dynamic random access memory (DRAM), a static random access memory (SRAM), a programmable memory (PROM), an electrically erasable programmable memory (EEPROM), or the like. As another example, semiconductor device 12 may comprise a so-called "microprocessor" or "microcontroller."

A dielectric layer 18 is disposed on active surface 13 of semiconductor device 12 to protect the same and to electrically isolate active surface 13 from circuitry of redistribution layer 20. By way of example only, dielectric layer 18 may be configured to prevent electrical interference between signals transmitted along the integrated circuitry (not shown) of semiconductor device 12 and those transmitted along the circuitry of redistribution layer 20. Also, dielectric layer 18 may be configured to prevent alpha particles, which are known to cause dissipation of stored charges within memory cells, from penetrating therethrough to the memory cells, if any, of the underlying semiconductor device 12. Of course, the material from which dielectric layer 18 is formed, as well as the thickness thereof, may contribute to the characteristics thereof. Materials that are suitable for use as dielectric layer 18 include, but are not limited to polyimides, silicon oxides, silicon nitrides, silicon oxynitrides, and the like. Dielectric layer 18 includes apertures 19 formed therethrough, through which bond pads 16 of semiconductor device 12 are exposed.

Redistribution layer 20 includes a plurality of circuits 22. Each circuit 22 communicates with a corresponding bond pad 16 of semiconductor device 12 and extends laterally to and communicates with a corresponding contact pad 30, adjacent to outer periphery 15 of semiconductor device 12.

Additionally, chip-scale package 10 may include a protective layer 40 over redistribution layer 20. Like dielectric layer 18, protective layer 40 comprises a material which is electrically insulative and which may prevent alpha particles from penetrating through to the underlying semiconductor device 12.

Turning now to FIGS. 3 through 14, an exemplary embodiment of a method for fabricating chip-scale package 10 is shown.

Figure 3:
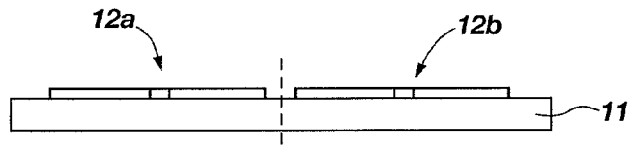
FIGS. 3 through 14 are cross-sectional representations of an exemplary method for forming the chip-scale package shown in FIGS. 1 and 2.

In FIG. 3, at least one semiconductor device 12 is provided. As shown, a semiconductor substrate 11 on which a plurality of semiconductor devices 12 (semiconductor devices 12a, 12b being shown) is carried may be provided. By way of example only, semiconductor substrate 11 may comprise a full or partial wafer of semiconductive material (e.g., silicon, gallium arsenide, indium phosphide, etc.), a so-called silicon-on-insulator (SOI) type substrate (e.g., silicon-on-ceramic (SOC), silicon-on-glass (SOG), silicon-on-sapphire (SOS), etc.), or a single-device or multiple-device section of any of the foregoing substrates.

Figure 4:
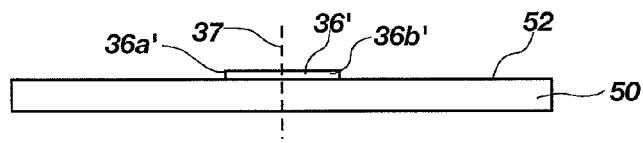

FIG. 4 depicts a sacrificial substrate 50 that has dimensions which are substantially the same as or larger than the corresponding dimensions of semiconductor substrate 11 (FIG. 3). As shown, a precursor pad 36', which is also referred to herein as a "conductive element," which is a precursor of lower section 36 of each contact pad 30 (FIGS. 1 and 2), is formed on an upper, or active, surface 52 of sacrificial substrate 50. The lowermost portion of each precursor pad 36' (i.e., that which is located adjacent surface 52) may include under-bump metallization (UBM) or bond-limiting metallurgy (BLM). Accordingly, each precursor pad 36' may include one or more sublayers of conductive material.

Each conductive material layer or sublayer may be formed by known processes, such as by one or more of physical vapor deposition (PVD) (e.g., sputtering), chemical vapor deposition (CVD), electrolytic plating, electroless plating, immersion plating, or the like. Depending upon the deposition technique(s) that is (are) used, as well as the order of deposition processes, one or more sublayers of each precursor pad 36' may be patterned, as known in the art (e.g., by use of mask and etch processes). For example, if a lowermost sublayer of conductive material is formed by PVD or CVD processes, that sublayer may be patterned prior to the formation of additional sublayers of conductive material thereover by electrolytic, electroless, or immersion plating processes. As another example, if multiple sublayers of conductive material are formed by PVD or CVD processes, patterning may be effected to form precursor pads 36' after all of the sublayers have been formed or following each set of consecutive PVD or CVD processes.

In the depicted example, a centerline 37 through each precursor pad 36' is aligned between adjacent semiconductor devices 12a and 12b carried by semiconductor substrate 11 (i.e., with a scribe line S, or "street," thereof). Accordingly, half 36a' of precursor pad 36' will be located beneath and positioned adjacent to an outer periphery 15a of a first semiconductor device 12a, while the other half 36b' of precursor pad 36' will be positioned beneath and adjacent to an outer periphery 15b of an adjacent semiconductor device 12b.

Figure 4A:
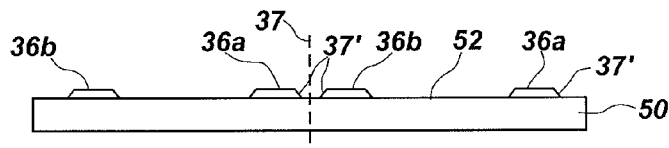

Alternatively, as shown in FIG. 4A, discrete lower sections 36a and 36b of contact pads 30 (FIGS. 1 and 2) may be preformed on surface 52 of sacrificial substrate 50, as known in the art. Discrete lower sections 36a and 36b may, as depicted, have chamfered edges 37'. Such chamfering of edges 37' of discrete lower sections 36a and 36b may provide a larger surface area than that provided by squared edges, ensuring that subsequently fabricated conductive structures will make adequate electrical contact to discrete lower sections 36a and 36b. Additionally, chamfered edges 37' of discrete lower sections 36a and 36b may facilitate the formation of chip-scale packages 10 (FIGS. 1 and 2) from semiconductor substrates 11 (FIG. 3) with relatively narrow streets S. Of course, discrete lowered sections 36a and 36b with squared edges 37' are also within the scope of the present invention.

Figure 5:
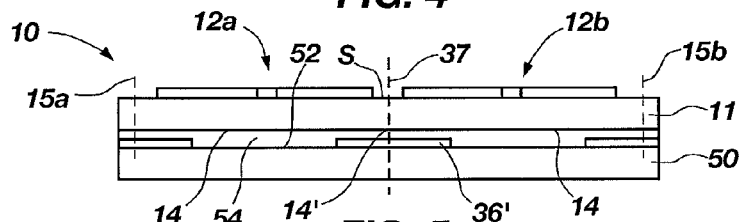
Figure 5A:
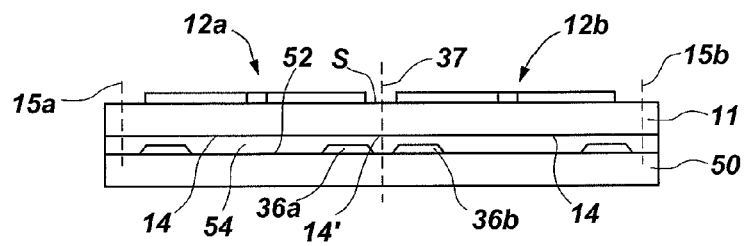

As depicted in FIGS. 5 and 5A, a back side 14' of semiconductor substrate 11, which is common to back sides 14 of the semiconductor devices 12 that are carried by semiconductor substrate 11, is positioned adjacent to surface 52 of sacrificial substrate 50. When semiconductor substrate 11 is positioned in this manner, semiconductor devices 12 which are carried thereby are aligned with corresponding precursor pads 36' (FIG. 5) or between corresponding discrete lower sections 36a, 36b (FIG. 5A) on surface 52 of sacrificial substrate 50.

Semiconductor substrate 11 and sacrificial substrate 50 may be secured to one another, as known in the art. A bonding agent 54 may be used to bond back side 14' of semiconductor substrate 11 to surface 52 of sacrificial substrate 50. Accordingly, bonding agent 54 may be applied to back side 14', to surface 52, or to both back side 14' and surface 52. By way of example only, known spin-on, spray-on, screen printing, and other application techniques may be used to apply bonding agent 54.

Bonding agent 54 may comprise an electrically insulative material. Thus, bonding agent 54 may subsequently form a dielectric layer on back side 14 of semiconductor device 12 of the resulting chip-scale package 10, as well as electrically isolate precursor pads 36' from back side 14 of each semiconductor device 12. Additionally, it is currently preferred that the adhesive material which is employed comprise a material that will apply little or no stress to semiconductor substrate 11 and sacrificial substrate 50, or a "low stress" material, thereby reducing the likelihood that either semiconductor substrate 11 or sacrificial substrate 50 will be damaged as chip-scale packages 10 are being formed. For example, and not to limit the scope of the present invention, bonding agent 54 may comprise an adhesive material. The material of bonding agent 54 may be stable at elevated temperatures, under reduced pressures (e.g., in a vacuum), when exposed to chemical environments, or other conditions to which bonding agent 54 will be exposed during downstream processes (e.g., fabrication of redistribution layers (RDLs)). Also, bonding agent 54 may comprise a material that will not outgas at any temperature, particularly the temperatures to which it will be exposed during fabrication of chip-scale packages 10 and operation of semiconductor devices 12 thereof. Exemplary materials that may be used as bonding agent 54 include, without limitation, any type of curable adhesive material that meets the specifications required for packaging semiconductor device components, such as thermoset adhesive materials, polyimides, and the like.

Figure 6:
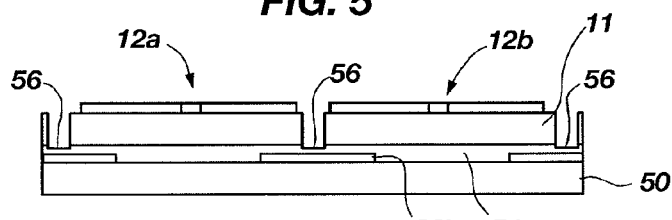
Figure 6A:
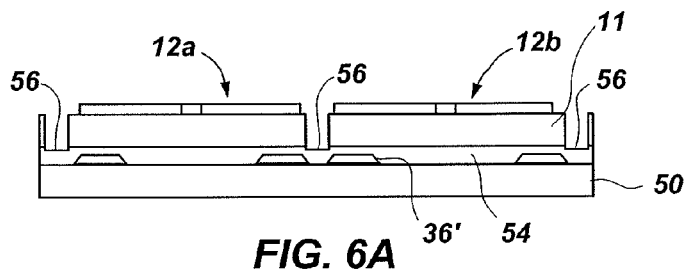

Once semiconductor substrate 11 and sacrificial substrate 50 have been bonded to one another and bonding agent 54 has sufficiently cured, adjacent semiconductor devices 12a, 12b are partially separated from one another, or singulated, along a street or scribe line S (FIG. 5) therebetween, as depicted in FIGS. 6 and 6A. Such separation or singulation may be effected as known in the art. By way of example and not to limit the scope of the present invention, a wafer saw of a known type may be employed. Of course, other known separation techniques (e.g., laser cutting or machining techniques, mask and etch processes, etc.) may also be employed. Laser cutting processes are particularly useful when strict control over the width and depth of cut lines 56 is desired, such as when semiconductor substrate 11 includes narrow streets S between adjacent semiconductor devices 12. The partial separation results in cut lines 56. Cut lines 56 may extend a depth which is substantially the same as the thickness of semiconductor substrate 11. As depicted, cut lines 56 do not extend completely through precursor pads 36'.

Figure 7:
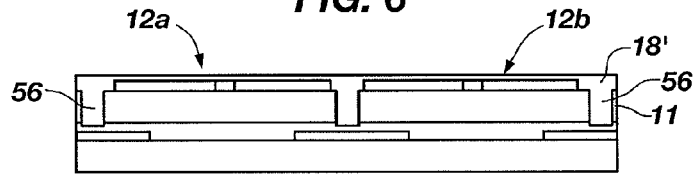
Figure 7A:
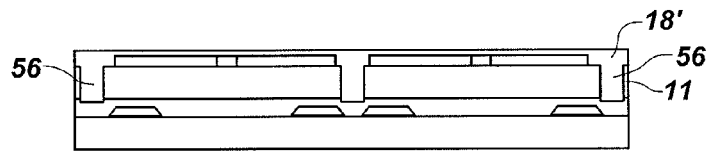

Subsequently, as shown in FIGS. 7 and 7A, a dielectric layer 18', which comprises electrically insulative material, is disposed on semiconductor substrate 11 and substantially fills cut lines 56. The electrically insulative material of dielectric layer 18' may, by way of example only, comprise a polymer, such as a photoimageable material (e.g., photoresist, photoimageable polyimide, etc.). If such a polymer is used, it may be applied to semiconductor substrate 11 by known processes, such as by spin-on techniques, use of a doctor blade, screen printing processes, or the like.

Figure 8:
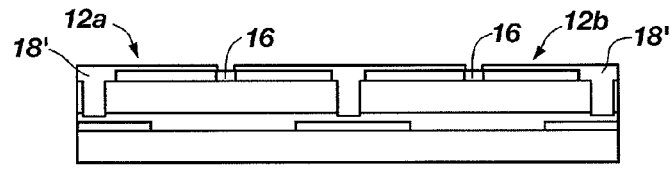
Figure 8A:
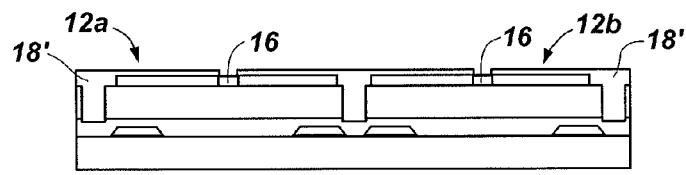

With reference to FIGS. 8 and 8A, bond pads 16 of each semiconductor device 12a, 12b are exposed through dielectric layer 18'. When dielectric layer 18' is formed from a photoimageable material, known photoimaging processes may be used. For example, if a photoimageable polyimide is employed, selected regions of uncured polyimide may be exposed to an appropriate wavelength of radiation and uncured material subsequently removed to expose bond pads 16. As another example, if a photoresist is employed as the electrically insulative material of dielectric layer 18', selected regions of the photoresist, depending, of course, upon whether the photoresist is a negative tone resist or positive tone resist, may be exposed to radiation of an appropriate wavelength, then chemically developed, as known in the art. Undeveloped and, thus, uncured regions of the photoresist are removed to expose bond pads 16. Of course, if another type of material is used to form dielectric layer 18', techniques that are appropriate for use of the type of material employed may be used to expose bond pads 16 (e.g., if the material of dielectric layer 18' comprises a silicon oxide, mask and etch processes may be used).

Figure 9:
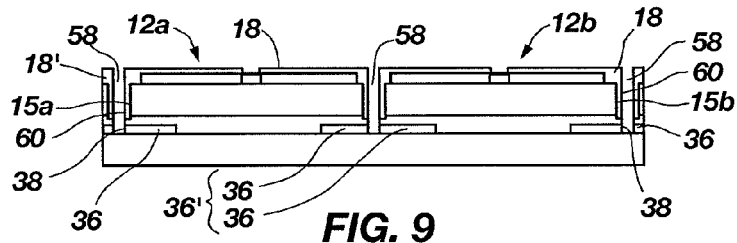
Figure 9A:
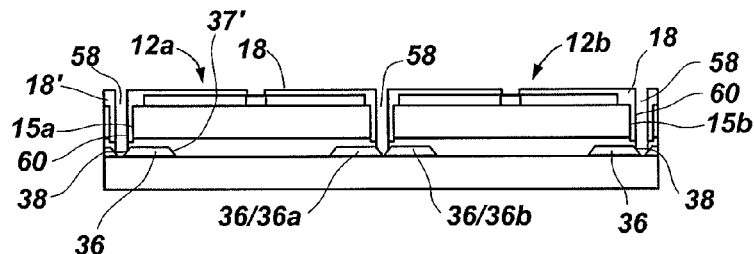

As shown in FIGS. 9 and 9A, cut lines 58 are formed between adjacent semiconductor devices 12a, 12b. Like cut lines 56 (FIG. 6), cut lines 58 may be formed by use of a wafer saw, laser cutting or machining techniques, mask and etch processes, or otherwise, as known in the art and suitable for use with the type of material from which dielectric layer 18' is formed. Again, the use of laser cutting techniques is particularly desirable when the formation of relatively narrow cut lines 58 of particular depth is desired. Cut lines 58, which are thinner or narrower than cut lines 56, extend through the electrically insulative material of dielectric layer 18', which is located between adjacent semiconductor devices 12a and 12b, leaving a peripheral dielectric coating 60 of the electrically insulative material on outer periphery 15a, 15b of semiconductor devices 12a and 12b. Also, cut lines 58 extend into and substantially through precursor pads 36' exposing at least one edge 38 of the resulting lower section 36 of contact pad 30 (FIGS. 1 and 2). It is currently preferred that, to optimize the robustness of the process described herein, particularly when sacrificial substrate 50 comprises a relatively weak material or when different temperature profiles are used to effect different aspects of the process (i.e., sacrificial substrate 50 is subjected to thermal stresses), cut lines 58 do not extend into sacrificial substrate 50. In the example illustrated in FIG. 9, each precursor pad 36' is severed into two lower sections 36 of contact pads 30, each corresponding to the semiconductor device 12a, 12b beneath which it is located. In the example shown in FIG. 9A, cut lines 58 extend to discrete lower sections 36a and 36b, exposing edges 37' thereof. Also as a result of the formation of cut lines 58, dielectric layer 18' is severed into a plurality of dielectric layers 18, one for each semiconductor device 12a, 12b.

Figure 10:
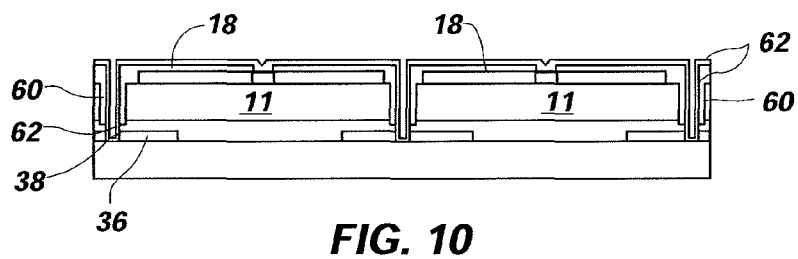

Next, with reference to FIG. 10, a conductive layer 62, which may include one or more metal sublayers, is deposited or otherwise disposed on semiconductor substrate 11. As illustrated, conductive layer 62 substantially overlies dielectric layers 18, as well as peripheral dielectric coatings 60. Conductive layer 62 also contacts and, thus, electrically communicates with the exposed edges 38 of lower sections 36 of contact pads 30 and the exposed bond pads 16 (FIGS. 1 and 2). Known processes, such as PVD or CVD processes, may be used to form at least a base portion of conductive layer 62, while these or other techniques, such as electrolytic, electroless, or immersion plating processes, may be used to form subsequent sublayers (not shown) of conductive layer 62.

Figure 11:
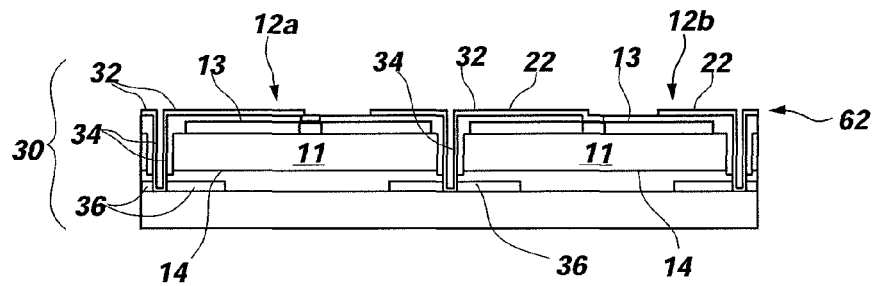

FIG. 11 illustrates patterning of conductive layer 62 to form circuits 22 of redistribution layer 20 (FIGS. 1 and 2), as well as contact pads 30. Known processes, such as mask and etch techniques, may be used to form circuits 22 and upper sections 32 of contact pads 30. Additionally, when conductive layer 62 is patterned, peripheral sections 34 are formed that communicate with upper sections 32 of the corresponding contact pads 30, as well as with lower sections 36 thereof. Upper sections 32 and their corresponding lower sections 36 may be located at substantially the same positions on opposite surfaces (i.e., active surface 13 and back side 14, respectively) of semiconductor device 12.

Figure 12:
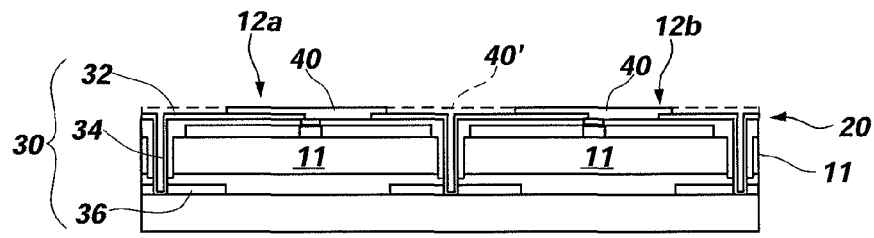

Once redistribution layer 20 has been formed, a protective layer 40 may be formed over redistribution layer 20 of each semiconductor device 12a, 12b, as shown in FIG. 12. Protective layer 40 is formed by applying a layer 40' of electrically insulative material over semiconductor substrate 11. The electrically insulative material of layer 40' may, by way of example only, comprise a polymer, such as a photoimageable polymer (e.g., a photoimageable polyimide, photoresist, etc.). If such a polymer is used, it may be applied to semiconductor substrate 11 by known processes, such as by spin-on techniques, use of a doctor blade, screen printing processes, or the like.

Still referring to FIG. 12, upper and peripheral sections 32 and 34 of contact pads 30 are exposed through layer 40'. When layer 40' is formed from a photoimageable material, known photoimaging processes may be used. For example, if a photoimageable polyimide is employed, selected regions of uncured polyimide may be exposed to an appropriate wavelength of radiation and uncured material subsequently removed to expose contact pads 30. As another example, if a photoresist is employed as the electrically insulative material of layer 40', selected regions of the photoresist, depending, of course, upon whether the photoresist is a negative tone resist or positive tone resist, may be exposed to radiation of an appropriate wavelength, then chemically developed, as known in the art. Undeveloped and, thus, uncured regions of the photoresist are removed to expose contact pads 30. Of course, if another type of material is used to form layer 40', techniques that are appropriate for use of the type of material employed may be used to expose contact pads 30 (e.g., if the material of layer 40' comprises a silicon oxide, mask and etch processes may be used).

Figure 13:
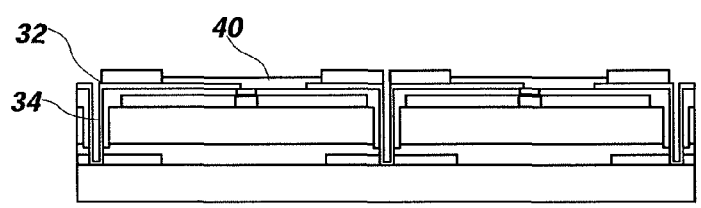
Figure 14:
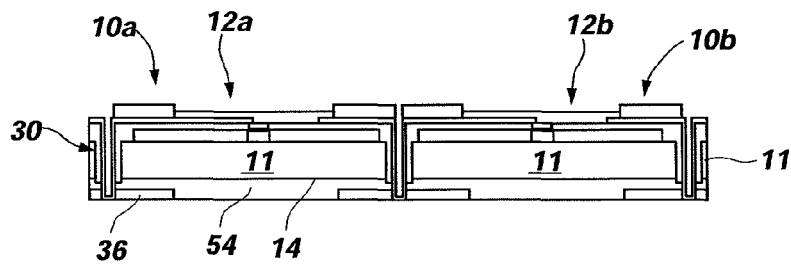

With reference to FIG. 13, one or more layers of UBM or BLM may be formed, as known in the art (e.g., by electrolytic, electroless, or immersion plating techniques), on exposed portions of each contact pad 30 (i.e., upper section 32 and peripheral section 34). Such UBM or BLM will prevent the material of contact pads 30 from oxidizing and facilitate adhesion of intermediate conductive elements, such as bond wires, solder bumps, or the like, thereto. When such processes are conducted, the sections of contact pads 30 that are coated in this manner may be recessed beneath the outer surface of protective layer 40, extend substantially therethrough, or protrude therefrom. If UBM or BLM is formed on any section of contact pads 30, such a coating may be formed before or after the formation of protective layer 40.

When fabrication of the elements of each chip-scale package 10 has been completed, adjacent chip-scale packages 10a, 10b, etc., may be separated, or singulated, from one another by known processes. As shown, semiconductor substrate 11 has already been severed to partially physically separate adjacent semiconductor devices 12a and 12b from one another. Accordingly, semiconductor devices 12a and 12b may be completely separated from one another and lower sections 36 of contact pads 30 exposed by removing sacrificial substrate 50 (FIGS. 4 and 5) from each chip-scale package 10a, 10b, etc. By way of example and not by way of limitation, known backgrinding processes, which have been conventionally employed to reduce the thicknesses of semiconductor substrates following the fabrication of semiconductor devices thereon, may be used to substantially remove sacrificial substrate 50 from each chip-scale package 10a, 10b, etc. Alternatively, known etching processes, which are, of course, suitable for use with the material or materials of sacrificial substrate 50, may be employed to remove sacrificial substrate 50. As illustrated, lower sections 36 may be exposed by use of such a technique, with bonding agent 54 remaining on and electrically insulating back side 14 of each semiconductor device 12a, 12b, etc.

Figure 15:
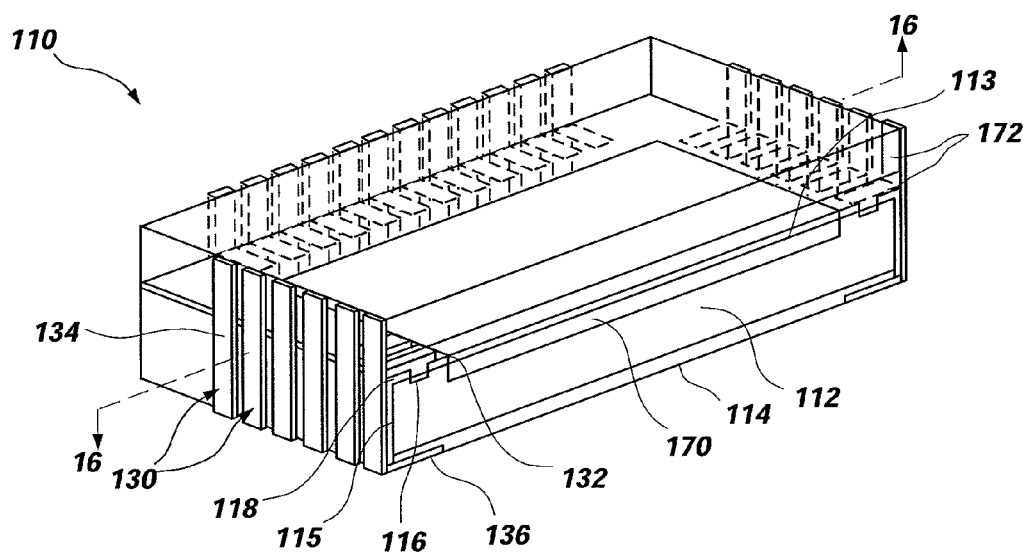
FIG. 15 is perspective view of another exemplary embodiment of chip-scale package that includes a sensor/emitter-type semiconductor device, as well as castellated contact pads positioned about the outer periphery thereof.
Figure 16:
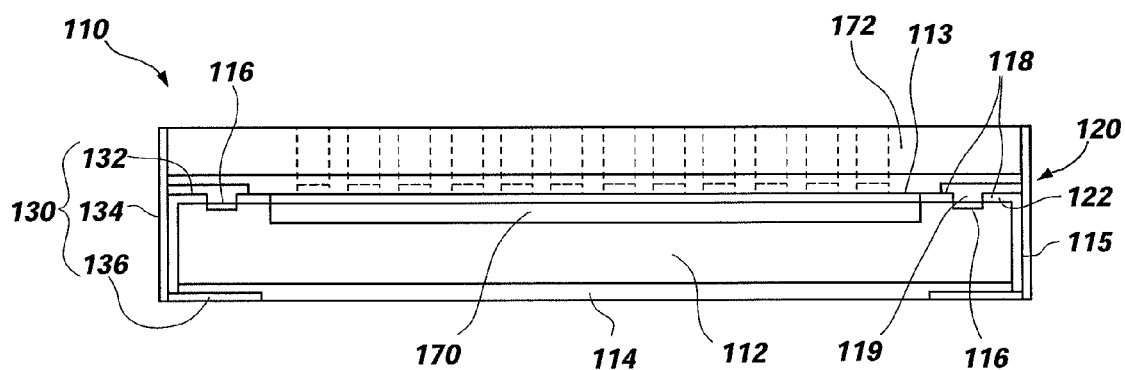
FIG. 16 is a cross-section taken along line 16-16 of FIG. 15.

Another exemplary embodiment of chip-scale package 110 that incorporates teachings of the present invention is depicted in FIGS. 15 and 16. Chip-scale package 110 includes a sensor-type semiconductor device 112, such as a CCD or other photocell, or a display-type device, such as an LED, a field emission device, or another emission device. Accordingly, semiconductor device 112 includes a sensing/emission area 170 which is exposed to an active surface 113 thereof. Additionally, to protect sensing/emission area 170, chip-scale package 110 includes an optically transparent lid 172 over at least a portion of sensing/emission area or region 170. Semiconductor device 112 also includes bond pads 116 on active surface 113 thereof, positioned between sensing/emission area 170 and outer peripheral edge 115 (also referred to as "outer periphery 115").

Chip-scale package 110 further includes a redistribution layer 120 over active surface 113 of semiconductor device 112, as well as contact pads 130 that extend from redistribution layer 120, around the outer peripheral edge 115 of semiconductor device 112, and onto a back side 114 of semiconductor device 112. Accordingly, each contact pad 130 includes an upper section 132, a peripheral section 134, and a lower section 136 (see FIG. 16). Contact pads 130 are referred to herein as "castellated contacts" since they are located adjacent to an outer peripheral edge 115 of semiconductor device 112 and, thus, at an outer peripheral edge 115 of chip-scale package 110 and impart chip-scale package 110 with a somewhat castellated appearance.

A dielectric layer 118 is disposed on active surface 113 of semiconductor device 112, laterally adjacent to optically transparent lid 172, to protect active surface 113 and to prevent electrical interference, or "crosstalk," between integrated circuitry of semiconductor device 112 and circuits 122 of redistribution layer 120. Dielectric layer 118 may also be configured to prevent alpha particles from penetrating therethrough to any memory cells or other charge-retaining areas of the underlying semiconductor device 112. Of course, the material from which dielectric layer 118 is formed, as well as the thickness thereof, may contribute to the characteristics thereof. Materials that are suitable for use as dielectric layer 118 include, but are not limited to polyimides, silicon oxides, silicon nitrides, silicon oxynitrides, and the like. Bond pads 116 of semiconductor device 112 are exposed through dielectric layer 118 by way of apertures 119 formed therethrough.

Redistribution layer 120 includes upper sections 132 of contact pads 130. Redistribution layer 120 may also include a plurality of circuits 122 that extend from bond pads 116 to upper sections 132 of corresponding contact pads 130.

Chip-scale package 110 may also include a protective layer (not shown) over redistribution layer 120. The protective layer comprises a material which is electrically insulative and which may prevent alpha particles from penetrating through to the underlying semiconductor device 112.

FIGS. 17 through 28 depict an exemplary process for packaging semiconductor devices 112 and, thus, for forming chip-scale packages 110 including the same.

Figure 17:
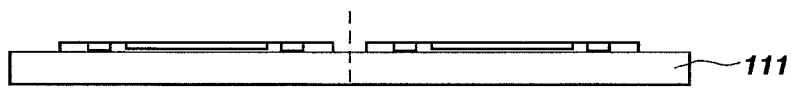
FIGS. 17 through 28 are cross-sectional representations that show an exemplary process for forming chip-scale packages of the type illustrated in FIGS. 15 and 16.

As illustrated in FIG. 17, a semiconductor substrate 111 is provided. By way of example only, semiconductor substrate 111 may comprise a full or partial wafer of semiconductive material, an SOI-type substrate, or a single-device or multiple-device section of any of the foregoing substrates.

Figure 18:
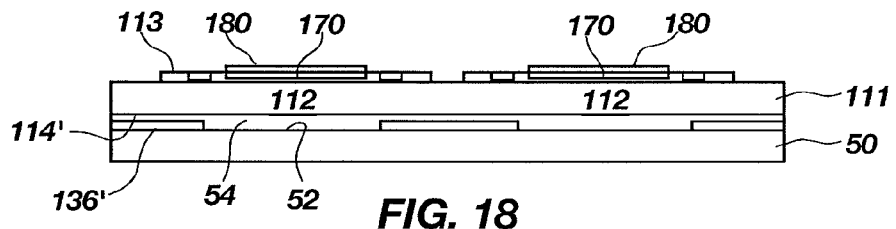

With reference to FIG. 18, a temporary protective layer 180 may be formed over sensing/emission area 170 of each semiconductor device 112. Temporary protective layer 180 may prevent contamination of sensing/emission area 170 while processes that must be conducted prior to the placement of an optically transparent lid 172 (FIGS. 15 and 16) thereover are effected.

Temporary protective layer 180 may be formed by applying a layer of photoresist to active surface 113 (e.g., by spin-on processes, use of a doctor blade, screen printing, etc.), then exposing and developing selected regions of the layer of photoresist. Of course, other materials (e.g., other photoimageable or nonphotoimageable polymers) and corresponding, suitable processes (e.g., spin-on processes for photoimageable materials, or screen printing for nonphotoimageable materials) may also be employed to form temporary protective layers 180 over sensing/emission areas 170 of semiconductor devices 112.

Also in FIG. 18, semiconductor substrate 111 is secured to a sacrificial substrate 50, such as that shown in FIG. 4. In particular, a bonding agent 54 of a known type, as described in reference to FIG. 5, may be applied to a surface 52 of sacrificial substrate 50, a back side 114' of semiconductor substrate 111, or both. The bonding agent 54 is applied in such a way (e.g., in a quantity) that will electrically isolate precursor pads 136' on surface 52 of sacrificial substrate 50 from back side 114' of semiconductor substrate 111. Back side 114' is positioned adjacent to and in contact with surface 52, with semiconductor devices 112 that are carried by semiconductor substrate 111 in alignment over corresponding portions of precursor pads 136'.

Figure 19:
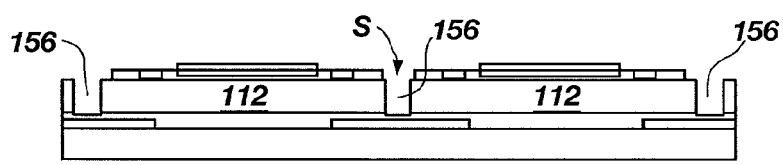

Once semiconductor substrate 111 and sacrificial substrate 50 have been secured to one another, adjacent semiconductor devices 112 are partially separated from one another, or singulated, along a street or scribe line S therebetween, as depicted in FIG. 19. Such separation or singulation may be effected as known in the art. By way of example and not to limit the scope of the present invention, a wafer saw of a known type may be employed. Of course, other known separation techniques (e.g., mask and etch processes, laser machining techniques, etc.) may also be employed. The partial separation results in cut lines 156, which may extend a depth which is substantially the same as the thickness of semiconductor substrate 111.

Figure 20:
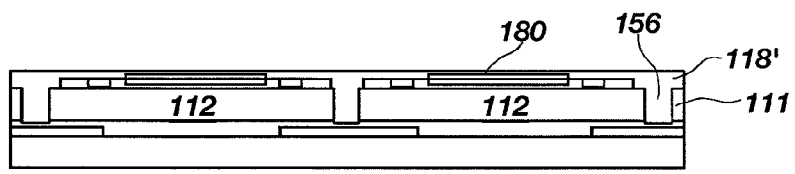

With reference to FIG. 20, a dielectric layer 118', which comprises electrically insulative material, is applied to or formed on semiconductor substrate 111 in such a way as to substantially fill cut lines 156. The electrically insulative material of dielectric layer 118' will withstand processes (e.g., resist strip processes) that are to be subsequently employed to remove the material of temporary protective layer 180. By way of example only, dielectric layer 118' may comprise a polymer, such as a photoimageable material (e.g., photoresist, photoimageable polyimide, etc.). If such a polymer is used, it may be applied to semiconductor substrate 111 by known processes, such as by spin-on techniques, use of a doctor blade, screen printing processes, or the like. Alternatively, spin-on-glass or another suitable, nonpolymeric, electrically insulative material may be used to form dielectric layer 118'.

Figure 21:
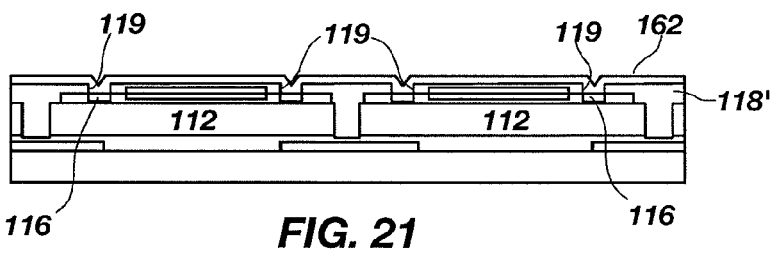

As shown in FIG. 21, dielectric layer 118' is patterned in such a way that apertures 119 are formed therethrough, over bond pads 116 of each semiconductor device 112. Thus, bond pads 116 are exposed through apertures 119 of dielectric layer 118'. Known processes, such as those mentioned above in reference to FIG. 8, may be used to pattern dielectric layer 118'.

Next, a conductive layer 162 is formed over dielectric layer 118' and in apertures 119. Like conductive layer 62 (FIG. 10), conductive layer 162 may include a single layer or a plurality of sublayers (not shown). If conductive layer 162 includes a single layer, known processes, such as PVD or CVD processes, may be used to form the same. If conductive layer 162 includes a plurality of sublayers, the lowermost sublayer may be formed, for example, by PVD or CVD processes, while a variety of techniques, including, without limitation, PVD, CVD, electrolytic plating, electroless plating, and immersion plating processes, may be used to form the remaining sublayers.

Figure 22:
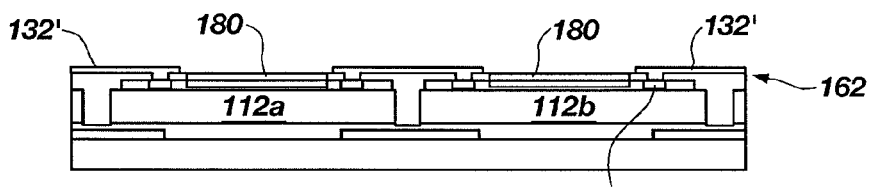
Figure 22A:
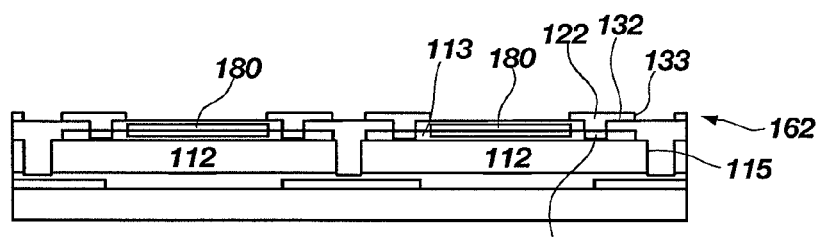

Referring now to FIG. 22, conductive layer 162 may be patterned to form upper precursor pads 132', which are precursors to upper sections 132 of contact pads 130 (FIGS. 15 and 16), that extend across the boundary between adjacent semiconductor devices 112a and 112b. As an alternative, depicted in FIG. 22A, conductive layer 162 may be patterned to form discrete upper sections 132 of contact pads 130, with a peripheral edge 133 of each upper section 132 being located substantially directly above and extending along substantially the same plane as outer periphery 115 of its corresponding semiconductor device 112. In addition, as shown in both FIG. 22 and in FIG. 22A, if bond pads 116 of semiconductor devices 112 are located on active surface 113 somewhat inwardly from outer periphery 115, circuits 122 may be formed so as to extend laterally from the locations of bond pads 116 to their corresponding upper precursor pads 132' (FIG. 22) or upper sections 132 (FIG. 22A) of contact pads 130 (FIGS. 15 and 16). Precursor pads 132', upper sections 132, and circuits 122, if any, may be formed by known processes, such as mask and etch techniques.

Figure 23:
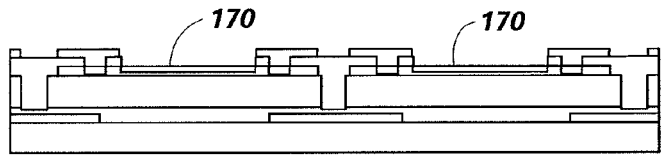

Once conductive layer 162 has been patterned, temporary protective layers 180 and regions of dielectric layer 118' that remain thereover may be removed to expose the underlying sensing/emission area 170, as shown in FIG. 23. For example, when temporary protective layers 180 has been formed from a photoresist, resist strip techniques that are suitable for use with that type of photoresist may be used to substantially remove the same. Depending on the type of material from which temporary protective layer 180 is formed, other, suitable processes (e.g., use of etchants, irradiation techniques, etc.) may be required to remove the same. Of course, it is currently preferred that the removal of temporary protective layer 180 be effected without substantially removing dielectric layer 118'.

Figure 24:
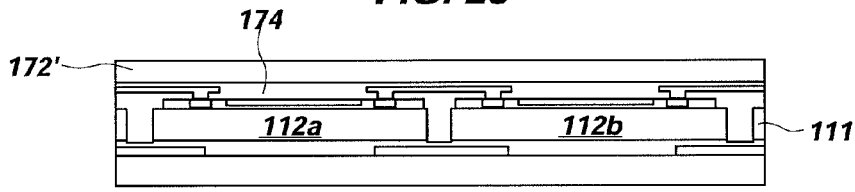

Next, as shown in FIG. 24, a preformed optically transparent lid 172' may be positioned over semiconductor substrate 111 and secured thereto with a quantity of optical grade adhesive 174. As shown, optically transparent lid 172' may cover a plurality of semiconductor devices 112 and, thus, extend over the boundaries between adjacent semiconductor devices 112a, 112b. By way of example only, optically transparent lid 172' may have substantially the same lateral dimensions as semiconductor substrate 111. A quantity of an optical grade adhesive 174 of a known type may be applied to one or both of optically transparent lid 172' and semiconductor substrate 111 by known techniques, such as use of a dispense needle, screen printing, spin-on processes, or the like. Once optically transparent lid 172' has been properly positioned over semiconductor substrate 111, optical grade adhesive 174 may cure or be caused to cure, as known in the art and as appropriate for the type of material used as optical grade adhesive 174.

Figure 24A:
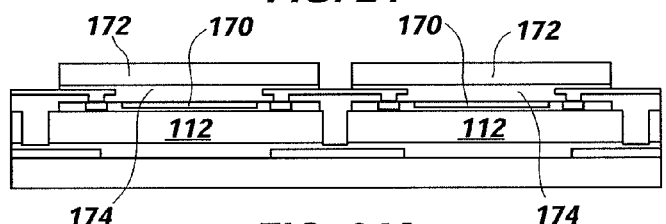

As an alternative to securing a single optically transparent lid 172' over semiconductor substrate 111, a plurality of individual optically transparent lids 172 may be positioned over sensing/emission area 170 of each semiconductor device 112 and secured to semiconductor device 112 with an optical grade adhesive 174, as known in the art and as depicted in FIG. 24A.

Figure 25:
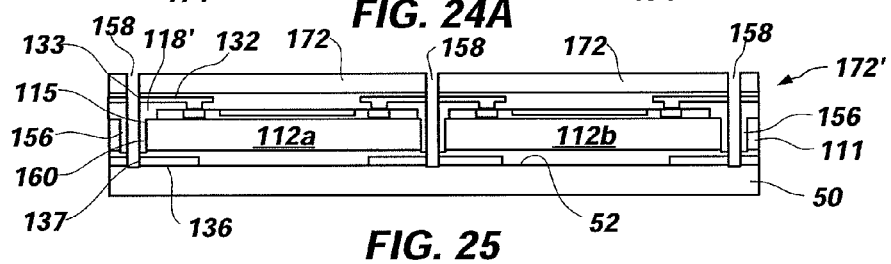

Referring now to FIG. 25, cut lines 158 are formed along the streets between adjacent semiconductor devices 112a and 112b. As depicted, each cut line 158 is aligned with a corresponding cut line 156 and is thinner, or narrower, than its corresponding cut line 156. As such, a peripheral dielectric coating 160 of the material of dielectric layer 118' remains on outer periphery 115 of each semiconductor device 112a, 112b, etc., so as to electrically insulate the same from a subsequently formed peripheral section 134 of each contact pad 130 (FIGS. 15 and 16). In addition, each cut line 158 exposes a peripheral edge 133 of upper section 132 of each contact pad 130, as well as peripheral edge 137 of lower section 136 of each contact pad 130.

Cut lines 158 are formed by a technique (e.g., with a wafer saw, by laser ablation, by etching processes, etc.) which is suitable for removing the material of dielectric layer 118' and, if a single optically transparent lid 172' has been employed, for removing the material of optically transparent lid 172'. Of course, if a single optically transparent lid 172' is present on semiconductor substrate 111 before cut lines 158 are formed, the formation of cut lines 158 results in the severing of optically transparent lid 172' into a plurality of individual optically transparent lids 172, with one optically transparent lid 172 being located over each semiconductor device 112a, 112b.

When upper precursor pads 132' or precursor pads 136' are present, the technique for forming cut lines 158 should also be suitable for removing the material of such precursor pads 132', 136'. Of course, when precursor pads 132' or 136' are severed during the formation of a cut line 158, they are bisected or otherwise split into upper sections 132a, 132b (collectively, upper sections 132) or lower sections 136a, 136b (collectively, lower sections 136) that are located on active surface 113 or back side 114 of adjacent semiconductor devices 112a, 112b, respectively, with peripheral edges 133, 137 being formed at each edge of that cut line 158.

As shown, each cut line 158 extends at least to surface 52 of sacrificial substrate 50.

Figure 26:
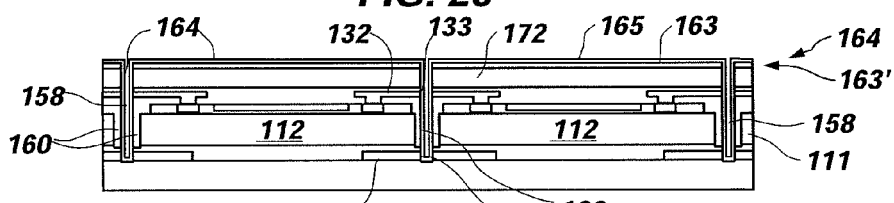

FIG. 26 depicts the disposal of a layer 163' of sacrificial material over semiconductor devices 112 (e.g., on optically transparent lids 172 and any other structures that are exposed laterally beyond optically transparent lids 172). By way of example and not by way of limitation, the sacrificial material of layer 163' may comprise a photoresist or another photoimageable material in an uncured state. Such a material may be applied to optically transparent lids 172 and introduced into cut lines 158 by known processes, such as by spin-on techniques, use of a doctor blade, or the like. When a photoresist is used, known patterning processes (e.g., selective exposure to radiation, then developing) may be used to selectively cure and form a sacrificial layer 163 from the uncured photoimageable material of layer 163'. Uncured portions of layer 163' are then removed from semiconductor substrate 111 (e.g., from cut lines 158), as known in the art (e.g., by known cleaning processes). As depicted, sacrificial layer 163 is located over semiconductor devices 112, but does not extend into cut lines 158.

Alternatively, an uncured polymer which is not photoimageable may be used to form layer 163'. Such a material may be applied over selected regions of semiconductor devices 112 (e.g., on optically transparent lids 172 thereof, but not within cut lines 158), such as by use of screen printing techniques, selective deposition processes (e.g., by use of a two-dimensional, ink jet-type printer), or the like. The material may then be permitted to harden (in the case of thermoplastic materials) or cure, or caused to cure (e.g., by exposure to heat, pressure, radiation of an appropriate wavelength, a chemical catalyst, etc.), as known in the art, to form sacrificial layer 163.

Once sacrificial layer 163 has been formed, a conductive layer 164 may be formed thereover. Like conductive layer 162 (FIG. 22), conductive layer 164 may include a single layer or a plurality of sublayers of conductive material. Of course, PVD or CVD techniques may be used to form all of conductive layer 164 or a lowermost sublayer thereof, while PVD, CVD, electrolytic plating, electroless plating, or immersion plating processes may be used to form any sublayers of conductive layer 164 that are located over the lowermost sublayer thereof.

As depicted, conductive layer 164 overlies semiconductor devices 112 (being located over optically transparent lids 172 that are disposed thereover), as well as lines peripheral dielectric coatings 160, which form the lateral surfaces of each cut line 158. Additionally, peripheral edges 133 of upper sections 132 of contact pads 130 (FIGS. 15 and 16) and edges 137 of lower sections 136 of contact pads 130, which are located within cut lines 158, are contacted by portions 166 of conductive layer 164 that are located within cut lines 158.

Figure 27:
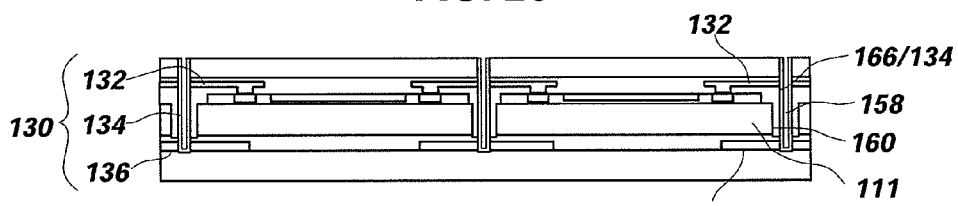

With reference to FIG. 27, sacrificial layer 163 (FIG. 26) may be removed by processes that are suitable for use with the material thereof. The portions 165 (FIG. 26) of conductive layer 164 (FIG. 26) that overlie sacrificial layer 163 are "lifted-off" by the process or processes that are used to remove sacrificial layer 163. As a nonlimiting example, if sacrificial layer 163 comprises a photoresist material, a resist strip which is able to remove that photoresist material may be used to substantially remove sacrificial layer 163, as well as to lift portions 165 of conductive layer 164 that previously overlaid sacrificial layer 163 off of semiconductor substrate 111 and away from semiconductor devices 112 that are carried thereby. As FIG. 27 illustrates, portions 166 of conductive layer 164 that are located within cut lines 158 remain therein following completion of the "lift-off" process.

With continuing reference to FIG. 27, portions 166 of conductive layer 164 that are located within cut lines 158 may be patterned, by known processes (e.g., mask and etch techniques), to form peripheral sections 134 of contact pads 130 (FIG. 27), which extend between their corresponding upper sections 132 and lower sections 136. Such patterning of portions 166 may be effected prior to the "lift-off" process, in which case sacrificial layer 163 (FIG. 26) should be formed from a material that may be removed without substantially removing the material of peripheral dielectric coatings 160. Alternatively, the patterning of portions 166 may be effected following the "lift-off" process, in which case the material of portions 166 shields the material of peripheral dielectric coatings 160 during the removal of sacrificial layer 163 and the resulting "lift-off" of portions 165 (FIG. 26) of conductive layer 164 (FIG. 26).

One or more layers of UBM or BLM may be formed, as known in the art (e.g., by electrolytic, electroless, or immersion plating techniques) on exposed portions of each contact pad 130 (e.g., peripheral section 134). Such UBM or BLM will prevent contact pads 130 from oxidizing and facilitate adhesion of intermediate conductive elements, such as bond wires, solder bumps, or the like, thereto.

Figure 28:
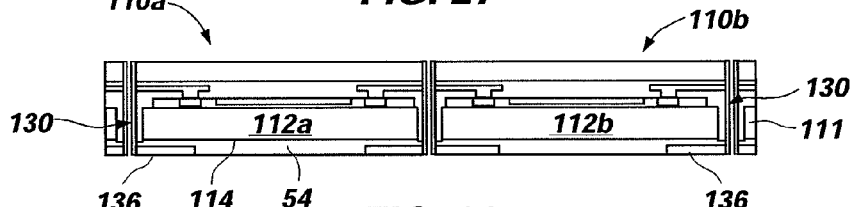

When fabrication of the elements of each chip-scale package 110 has been completed, as shown in FIG. 28, adjacent chip-scale packages 110a, 110b, etc., may be separated, or singulated, from one another by known processes. As shown, semiconductor substrate 111 has already been severed to partially physically separate adjacent semiconductor devices 112a and 112b from one another. Accordingly, semiconductor devices 112a and 112b may be completely separated from one another and lower sections 136 of contact pads 130 exposed by removing sacrificial substrate 50 (FIG. 18) from each chip-scale package 110a, 110b, etc. By way of example and not by way of limitation, known backgrinding processes may be used to substantially remove sacrificial substrate 50 from each chip-scale package 110a, 110b, etc. Alternatively, known etching processes, which are, of course, suitable for use with the material or materials of sacrificial substrate 50, may be employed to remove sacrificial substrate 50. As illustrated, lower sections 136 may be exposed by use of such a technique, with bonding agent 54 remaining on and electrically insulating back side 114 of each semiconductor device 112a, 112b, etc.

Figure 29:
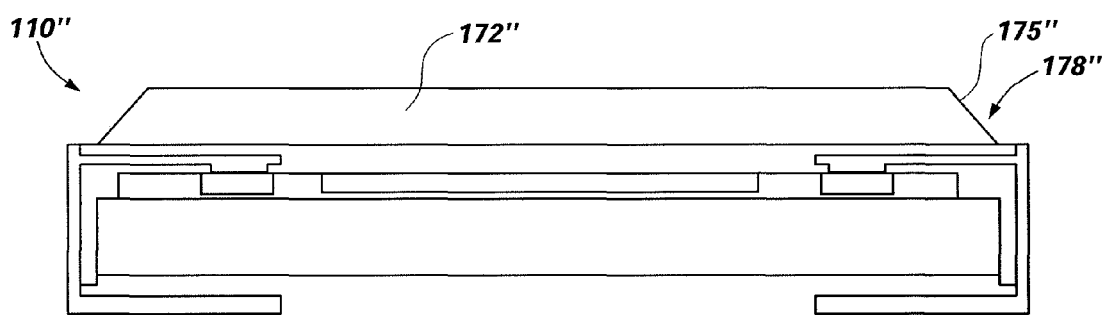
FIG. 29 is a cross-sectional representation of a variation of the chip-scale package shown in FIG. 15, in which an optically transparent lid disposed over a sensing/emission area of the semiconductor device includes chamfered edges.

Turning now to FIG. 29, a variation of chip-scale package 110 (FIGS. 15 and 16), which variation is identified herein as chip-scale package 110" (and hereinafter as chip-scale packages 110a", 110b", etc.), is depicted. Chip-scale package 110" differs from chip-scale package 110 in that optically transparent lid 172" includes bevels or chamfers 178" at peripheral edges 175" thereof.

Figure 30:
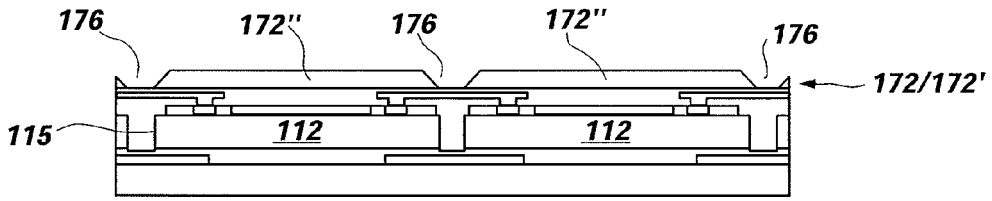
FIGS. 30 through 35 are cross-sectional representations that depict exemplary processes that may be used in the formation of chip-scale packages of the type shown in FIG. 29.

A plurality of chip-scale packages 110" may be formed by repeating the processes that have been described with reference to FIGS. 17-24A. Turning to FIG. 30, when one or more optically transparent lids 172" (or transparent lids 172' (FIG. 24), 172 (FIG. 24A)) have been secured in place over semiconductor devices 112, a bevel cut 176 may be made at locations of each optically transparent lid 172", 172', 172 that is positioned over and laterally adjacent to outer peripheral edges 115 of semiconductor devices 112. Such a bevel cut 176 may be formed, for example, by use of a saw (e.g., a wafer saw) having a beveled edge on each side thereof, by way of isotropic etching processes, or otherwise, as known in the art.

Figure 31:
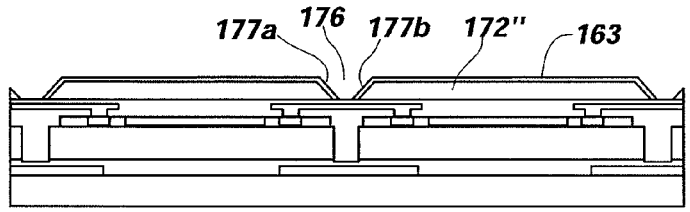

Following the formation of bevel cut 176, as shown in FIG. 31, a sacrificial layer 163 may be formed over optically transparent lids 172", such as in the manner that has been described herein with reference to FIG. 26. It is currently preferred that sacrificial layer 163 overlie the bevels 177a and 177b at each side of bevel cut 176.

Figure 32:
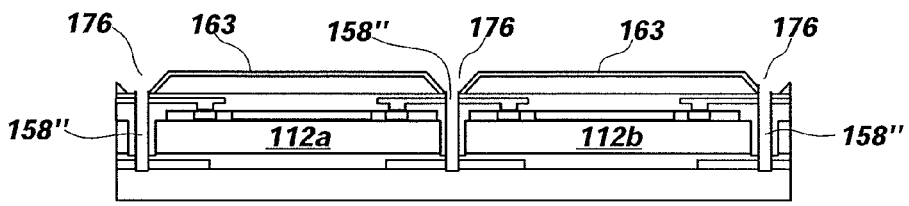

Thereafter, as FIG. 32 illustrates, a cut line 158" may be formed between each pair of adjacent semiconductor devices 112a and 112b, as described in reference to FIG. 25. Of course, each cut line 158" is aligned with and substantially centered along a corresponding bevel cut 176. By forming sacrificial layer 163 prior to the formation of cut line 158", the introduction of the material of sacrificial layer 163 into cut line 158" is avoided.

Figure 33:
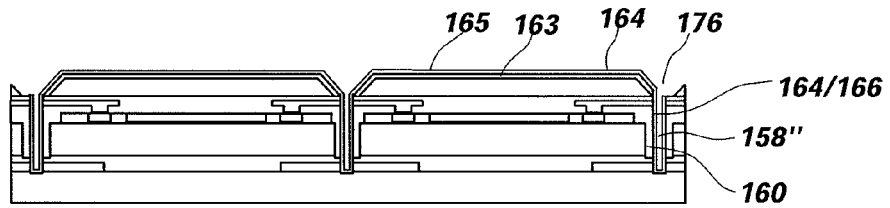

In FIG. 33, a conductive layer 164 is formed over sacrificial layer 163 and on peripheral dielectric coating 160 at each lateral edge of each cut line 158". As an example only, conductive layer 164 may be formed by the processes that are described herein with reference to FIG. 26. As each bevel cut 176 forms an opening to its corresponding cut line 158", which is significantly larger than the opening of cut line 158 shown in FIG. 26, bevel cuts 176 may improve the deposition of conductive layer 164 on peripheral dielectric coatings 160 within cut line 158". Additionally, edges 133' of upper sections 132 of contact pads 130 (FIGS. 15 and 16) and edges 137 of lower sections 136 of contact pads 130, which are located within cut lines 158", are contacted by portions 166 of conductive layer 164 that are located within cut lines 158".

Figure 34:
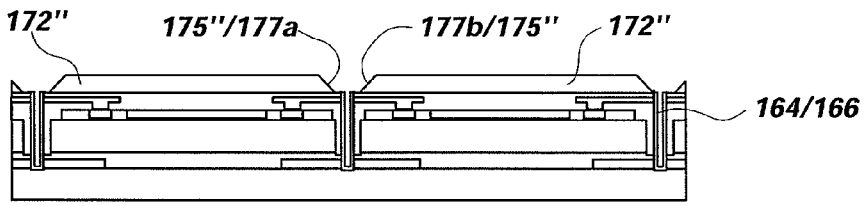
Figure 35:
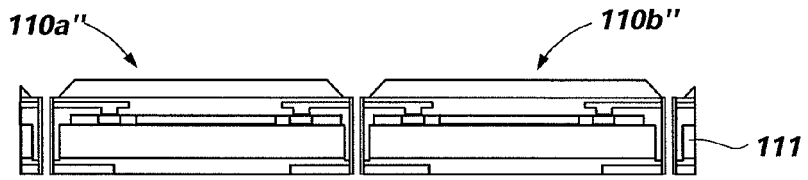

Next, as depicted in FIG. 34, portions 165 (FIG. 33) of conductive layer 164 (FIG. 33) that overlie sacrificial layer 163 may be removed, or "lifted-off," by substantially removing sacrificial layer 163. Sacrificial layer 163 may be substantially removed, for example, by one of the processes that have been described in reference to FIG. 27. As sacrificial layer 163 coats bevels 177a and 177b, sacrificial layer 163 also prevents the conductive material of portions 165 from remaining on peripheral edges 175" of optically transparent lid 172". Patterning of portions 166 of conductive layer 164 that reside within cut lines 158" may be effected, as shown in FIG. 34 and as described herein with reference to FIG. 27. Thereafter, as shown in FIG. 35 and as described with reference to FIG. 28, sacrificial substrate 50 may be removed from semiconductor substrate 111 to completely separate chip-scale packages 110a", 110b", etc., from one another.

Figure 36:
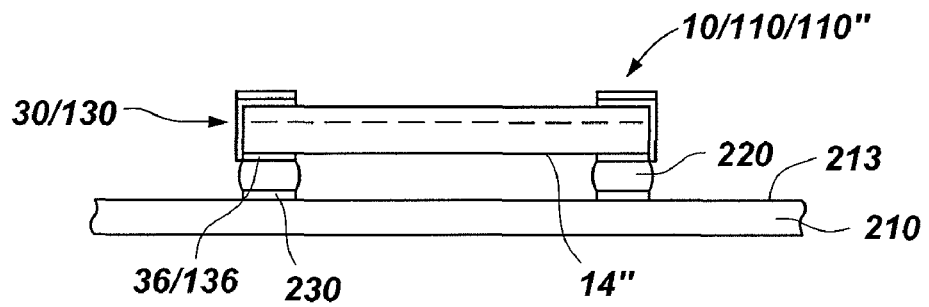
FIGS. 36 through 40 are cross-sectional representations illustrating various manners in which a chip-scale package according to the present invention may be electrically connected to another semiconductor device component or other electronic component.
Figure 37:
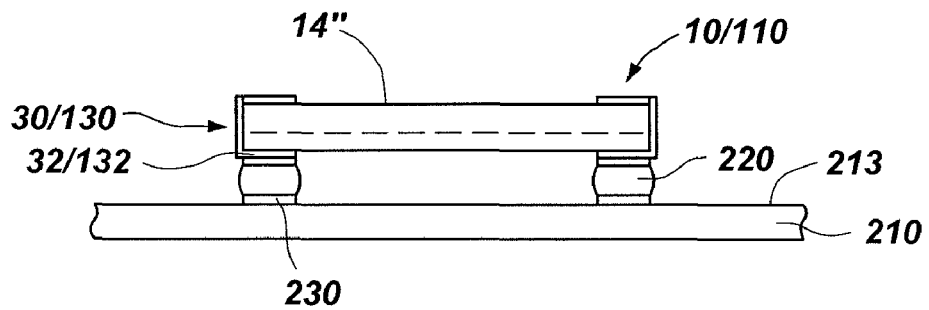
Figure 38:
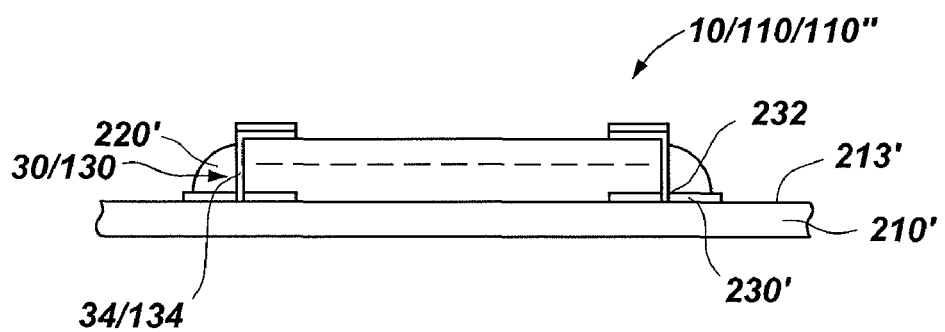

Turning now to FIGS. 36 through 38, exemplary techniques for securing a chip-scale package 10, 110, 110" according to the present invention to a carrier substrate 210 (e.g., a circuit board) therefor are depicted.

Figure 39:
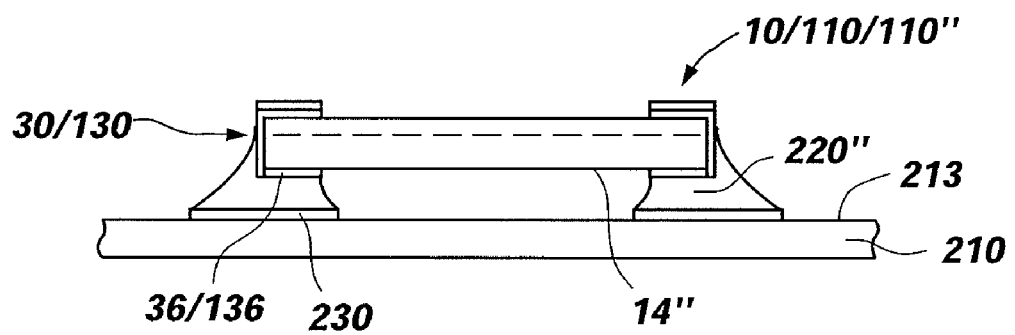

In FIGS. 36 and 39, chip-scale package 10, 110, 110" is positioned over carrier substrate 210 with a bottom surface 14" of chip-scale package 10, 110, 110" facing an upper surface 213 of carrier substrate 210. Intermediate conductive elements 220, 220", which are respectively shown as being conductive balls (e.g., solder balls) and larger, nonspherical conductive structures, but which may alternatively comprise bumps, columns, pillars, or pins of solder, another metal, conductive or conductor-filled epoxy, or any other suitable conductive material, or which may comprise z-axis conductive elements of a film of anisotropic conductive film, are positioned between bottom surface 14" of chip-scale package 10, 110, 110" and upper surface 213 of carrier substrate 210. As shown, intermediate conductive elements 220, 220" extend between and contact lower sections 36, 136 of contact pads 30, 130 of chip-scale package 10, 110, 110" and corresponding terminals 230 of carrier substrate 210.

Figure 40:
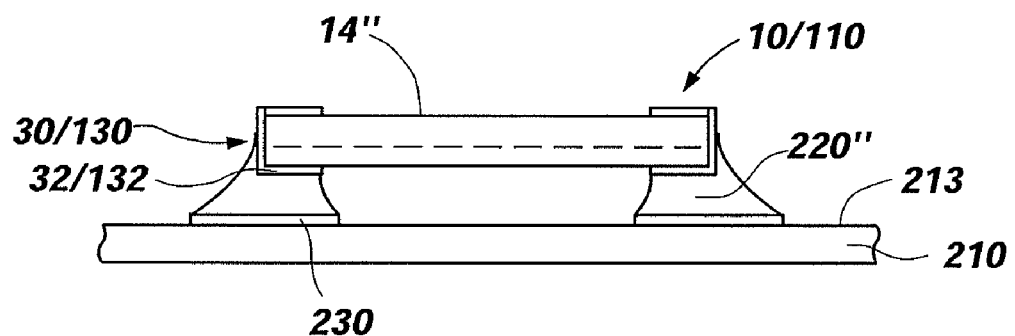

Alternatively, as shown in FIGS. 37 and 40, chip-scale package 10, 110 may be oriented face-down over surface 213 of carrier substrate 210. Of course, in this orientation, bottom surface 14" of chip-scale package 10, 110 faces away from (i.e., in the same direction as) surface 213 of carrier substrate 210. As shown, intermediate conductive elements 220, 220" are positioned between chip-scale package 10, 110 and carrier substrate 210 and electrically connect upper sections 32, 132 of contact pads 30, 130 with corresponding terminals 230.

Another alternative, which is shown in FIG. 38, may be used to electrically connect chip-scale package 10, 110, 110" to a carrier substrate 210' therefor in a face-up orientation, or to electrically connect chip-scale package 10, 110, 110" to carrier substrate 210' in a face-down orientation. As illustrated, chip-scale package 10, 110, 110" is positioned on a surface 213' of carrier substrate 210' within a boundary defined by terminals 230' thereon. A peripheral section 34, 134 of each contact pad 30, 130 of chip-scale package 10, 110, 110" is laterally aligned with a corresponding terminal 230' of carrier substrate 210'. Intermediate conductive elements 220', which comprise bumps of conductive material, are disposed in a corner 232 formed at the junction between each peripheral section 34, 134 and its corresponding terminal 230'.

Similar electrical connections may be made between chip-scale packages that incorporate teachings of the present invention and other types of carriers or electronic components, as well as between multiple inventive chip-scale packages.

Figure 41:
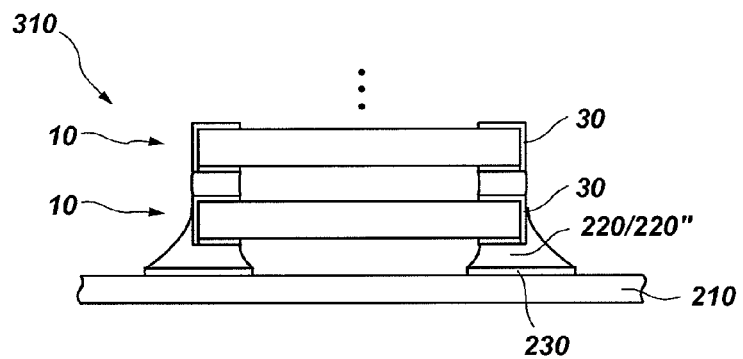
FIG. 41 is a side view depicting an exemplary stacked assembly that includes chip-scale packages according to the present invention.

FIG. 41 illustrates a stacked multi-chip module 310, which includes a carrier substrate 210 and a plurality of chip-scale packages 10 according to the present invention that have been stacked relative to one another over carrier substrate 210. Corresponding contact pads 30 of chip-scale packages 10 are electrically connected to one another and to corresponding terminals 230 of carrier substrate 210 by way of intermediate conductive elements 220, 220".

Figure 42:
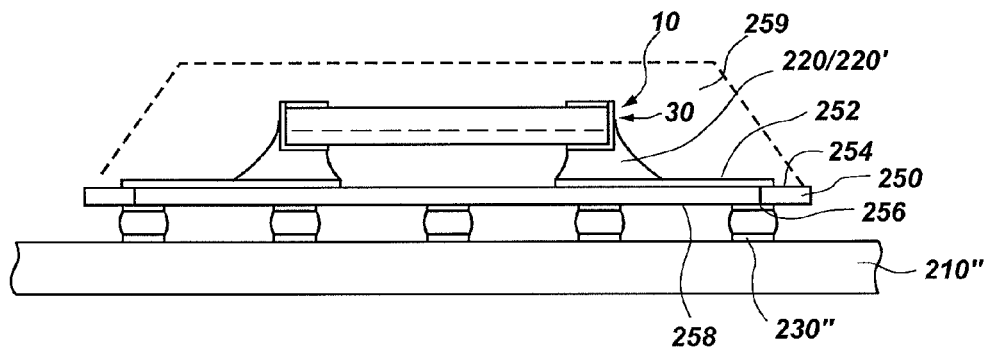
FIG. 42 is a cross-sectional representation of an exemplary packaged chip-scale package of the present invention, which includes a chip-scale package, a circuit board for reconfiguring the connection pattern of the chip-scale package, and an encapsulant material over the chip-scale package.

FIG. 42 depicts use of a chip-scale package 10 of the present invention with a redistribution carrier 250 of a type known in the art (e.g., a printed circuit board), which includes conductive traces 254 on a first side 252 thereof that redistribute the connection pattern provided by contacts 30 of chip-scale package 10 to another arrangement of terminals 256 on an opposite, second side 258 of redistribution carrier 250. The arrangement of terminals 256 on redistribution carrier 250, in turn, corresponds to the connection pattern of corresponding terminals 230" on a carrier substrate 210" to which chip-scale package 10 is to be electrically connected, as known in the art. Chip-scale package 10 and an adjacent surface of redistribution carrier 250 may also be at least partially encapsulated within a packaging material 259.

Figure 43:
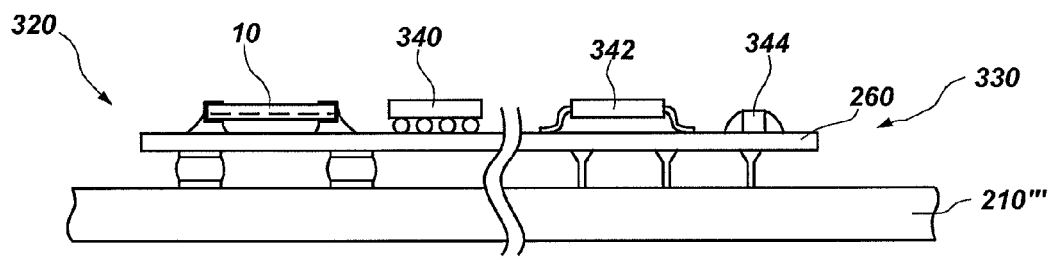
FIG. 43 is a schematic representation of a multi-chip module that includes several semiconductor devices, including a chip-scale package that incorporates teachings of the present invention.

FIG. 43 depicts a semiconductor device assembly 320 which includes a carrier substrate 210'" with a multi-chip module 330 secured and electrically connected thereto. Multi-chip module 330 includes a substrate 260 with at least one chip-scale package 10 and one or more other types of semiconductor device packages 340, 342, 344 thereon.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Moreover, features from different embodiments of the invention may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A semiconductor device assembly, comprising:
    an electronic device component having a chip-bearing surface carrying a plurality of contacts;
    a chip-scale package positioned over the chip-bearing surface of the electronic device component, the chip-scale package including:
        a semiconductor device; and
        a plurality of contacts substantially corresponding to the plurality of contacts of the electronic device component, each chip-scale package contact of the plurality of contacts including:
            an upper element extending over a portion of an active surface of the semiconductor device of the chip-scale package;
            a peripheral element extending from at least an active surface of the semiconductor device over a portion of a lateral periphery of the semiconductor device to at least a back side of the semiconductor device; and
            a bottom element extending over a portion of the back side of the semiconductor device;
            wherein the upper element and the bottom element are in contact with the peripheral element and a peripheral end of at least one of the upper element and the bottom element forms a discernable boundary with an inner surface of the peripheral element; and
    intermediate conductive elements operably coupled between and in direct contact with at least some contacts of the plurality of contacts of the electronic device component and at least the bottom element of corresponding chip-scale package contacts.

2. The semiconductor device assembly of claim 1, wherein the back side of the semiconductor device of the chip-scale package is spaced apart from the chip-bearing surface of the electronic device component by the intermediate conductive elements.

3. The semiconductor device assembly of claim 1, wherein each intermediate conductive element is also operably coupled to the peripheral element of a corresponding chip-scale package contact by direct contact with the intermediate conductive element.

4. The semiconductor device assembly of claim 3, wherein each intermediate conductive element of the intermediate conductive elements comprises a metal material.

5. The semiconductor device assembly of claim 4, wherein each intermediate conductive element of the intermediate conductive elements comprises solder.

6. The semiconductor device assembly of claim 1, further comprising:

another chip-scale package oriented at least partially over the active surface of the chip-scale package, the another chip-scale package including:
a semiconductor device; and
a plurality of contacts corresponding to the plurality of contacts of the chip-scale package, each chip-scale package contact of the plurality of contacts of the another chip-scale package including:
a bottom element extending over a portion of a back side of the semiconductor device; and
intermediate conductive elements operably coupled between the upper element of at least some chip-scale package contacts of the chip-scale package and at least the bottom element of a corresponding chip-scale package contact of the another chip-scale package.

7. The semiconductor device assembly of claim 1, wherein the electronic device component comprises a redistribution carrier.

8. The semiconductor device assembly of claim 7, wherein the redistribution carrier includes a back side opposite the chip-bearing surface.

9. The semiconductor device assembly of claim 8, further comprising:
a carrier substrate; and
intermediate conductive elements electrically coupling terminals of the carrier substrate to corresponding terminals of the redistribution carrier.

10. The semiconductor device assembly of claim 9, wherein the redistribution carrier is superimposed over at least a portion of the carrier substrate, terminals of the redistribution carrier are substantially aligned with corresponding terminals of the carrier substrate, and the intermediate conductive elements are disposed between substantially aligned pairs of corresponding terminals of the redistribution element and the carrier substrate.

11. The semiconductor device assembly of claim 1, wherein the chip-scale package further includes:
a redistribution layer over an active surface of the semiconductor device extending between bond pads of the semiconductor device and upper elements of contacts of the plurality of contacts;
a peripheral dielectric coating covering at least a portion of an outer lateral periphery of the semiconductor device, the peripheral dielectric coating including an edge adjacent to a junction between a lateral periphery and a back side of the semiconductor device;
a back side dielectric coating on at least a portion of the back side of the semiconductor device and including a peripheral edge abutting and forming a discernable boundary with a major surface of the peripheral dielectric coating;
the peripheral element of each chip-scale package contact being carried by the peripheral dielectric coating, spaced apart from the back side dielectric coating by the peripheral dielectric coating, and including an end adjacent to the edge of the peripheral dielectric coating; and
the bottom element of each chip-scale package contact being carried partially by the back side dielectric coating, the edge of the peripheral dielectric coating and the end of the peripheral element abutting and forming a discernable boundary with a peripheral edge of the bottom element.

12. The semiconductor device assembly of claim 1, wherein the chip-scale package further includes:
a redistribution layer over an active surface of the semiconductor device extending from bond pads of the semiconductor device to upper elements of contacts of the plurality of contacts of the semiconductor device; and
a peripheral dielectric coating covering at least a portion of an outer lateral periphery of the semiconductor device between the active surface and back side of the semiconductor device under the peripheral elements of the plurality of contacts of the semiconductor device;
a back side dielectric coating on at least a portion of the back side of the semiconductor device and including a peripheral edge abutting and forming a discernable boundary with the peripheral dielectric coating; and
the bottom element of each chip-scale package contact extending over a portion of the back side dielectric coating.

13. A semiconductor device assembly, comprising an electronic device component having a chip-scale package mounted thereto, the chip-scale package including:
a semiconductor device; and
a plurality of contacts, each chip-scale package contact of the plurality of contacts including:
an upper element extending over a portion of an active surface of the semiconductor device of the chip-scale package;
a peripheral element extending from a location at least adjacent an active surface of the semiconductor device over a portion of a lateral periphery of the semiconductor device to a location at least adjacent a back side of the semiconductor device; and
a bottom element extending over a portion of the back side of the semiconductor device;
wherein the upper element and the bottom element are in contact with the peripheral element and a peripheral end of at least one of the upper element and the bottom element forms a discernable boundary with an inner surface of the peripheral element.

14. The semiconductor device assembly of claim 13, further comprising:
another chip-scale package oriented at least partially over the active surface of the chip-scale package, the another chip-scale package including:
a semiconductor device; and
a plurality of contacts corresponding to the plurality of contacts of the chip-scale package, each chip-scale package contact of the plurality of contacts of the another chip-scale package including:
a bottom element extending over a portion of a back side of the semiconductor device; and
intermediate conductive elements operably coupled between the upper element of at least some chip-scale package contacts of the chip-scale package and at least the bottom element of a corresponding chip-scale package contact of the another chip-scale package.

15. The semiconductor device assembly of claim 14, wherein the electronic device component comprises a redistribution carrier having a chip-bearing surface.

16. The semiconductor device assembly of claim 15, wherein the redistribution carrier includes a back side opposite the chip-bearing surface.

17. The semiconductor device assembly of claim 16, further comprising:
a carrier substrate; and
intermediate conductive elements electrically coupling terminals of the carrier substrate to corresponding terminals of the redistribution carrier.

18. The semiconductor device assembly of claim 17, wherein the redistribution carrier is superimposed over at least a portion of the carrier substrate, terminals of the redistribution carrier are substantially aligned with corresponding terminals of the carrier substrate, and the intermediate conductive elements are disposed between substantially aligned pairs of corresponding terminals of the redistribution element and the carrier substrate.

19. The semiconductor device assembly of claim 13, wherein the chip-scale package further includes:
   a redistribution layer over an active surface of the semiconductor device extending between bond pads of the semiconductor device and upper elements of contacts of the plurality of contacts;
   a peripheral dielectric coating covering at least a portion of an outer lateral periphery of the semiconductor device, the peripheral dielectric coating including an edge adjacent to a junction between a lateral periphery and a back side of the semiconductor device;
   a back side dielectric coating on at least a portion of the back side of the semiconductor device and including a peripheral edge abutting and forming a discernable boundary with a major surface of the peripheral dielectric coating;
   the peripheral element of each chip-scale package contact being carried by the peripheral dielectric coating, spaced apart from the back side dielectric coating by the peripheral dielectric coating, and including an end adjacent to the edge of the peripheral dielectric coating; and
   the bottom element of each chip-scale package contact carried partially by the back side dielectric coating, the edge of the peripheral dielectric coating and the end of the peripheral element abutting and forming a discernable boundary with a peripheral edge of the bottom element.

20. The semiconductor device assembly of claim 13, wherein the chip-scale package further includes:
   a redistribution layer over an active surface of the semiconductor device extending from bond pads of the semiconductor device to upper elements of contacts of the plurality of contacts of the semiconductor device; and
   a peripheral dielectric coating covering at least a portion of an outer lateral periphery of the semiconductor device between the active surface and back side of the semiconductor device under the peripheral elements of the plurality of contacts of the semiconductor device;
   a back side dielectric coating on at least a portion of the back side of the semiconductor device and including a peripheral edge abutting and forming a discernable boundary with the peripheral dielectric coating; and
   the bottom element of each chip-scale package contact extending over a portion of the back side dielectric coating.

* * * * *